(12) United States Patent
Dahlberg et al.

(10) Patent No.: US 11,078,112 B2
(45) Date of Patent: Aug. 3, 2021

(54) SILICA-CONTAINING SUBSTRATES WITH VIAS HAVING AN AXIALLY VARIABLE SIDEWALL TAPER AND METHODS FOR FORMING THE SAME

(71) Applicant: CORNING INCORPORATED, Corning, NY (US)

(72) Inventors: Rachel Eileen Dahlberg, State College, PA (US); Tian Huang, Painted Post, NY (US); Yuhui Jin, Painted Post, NY (US); Garrett Andrew Piech, Corning, NY (US); Daniel Ohen Ricketts, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 15/978,430

(22) Filed: May 14, 2018

(65) Prior Publication Data

US 2018/0342451 A1 Nov. 29, 2018

Related U.S. Application Data

(60) Provisional application No. 62/588,615, filed on Nov. 20, 2017, provisional application No. 62/510,957, filed on May 25, 2017.

(51) Int. Cl.
*C03C 15/00* (2006.01)
*C03C 23/00* (2006.01)
(Continued)

(52) U.S. Cl.
CPC ...... *C03C 23/0025* (2013.01); *B23K 26/0006* (2013.01); *B23K 26/06* (2013.01);
(Continued)

(58) Field of Classification Search
None
See application file for complete search history.

(56) References Cited

U.S. PATENT DOCUMENTS

| 108,387 A | 10/1870 | Pike |
| 208,387 A | 9/1878 | George |

(Continued)

FOREIGN PATENT DOCUMENTS

| AU | 2004276725 A1 | 4/2005 |
| AU | 2011101310 A4 | 11/2011 |

(Continued)

OTHER PUBLICATIONS

Machine Translation of JP-2004363212-A, Dec. 2004 (Year: 2004).*
(Continued)

*Primary Examiner* — Jeffrey A Vonch
(74) *Attorney, Agent, or Firm* — Amy T. Lang

(57) ABSTRACT

Silica-containing substrates including vias with a narrow waist, electronic devices incorporating a silica-containing substrate, and methods of forming vias with narrow waist in silica-containing substrates are disclosed. In one embodiment, an article includes a silica-containing substrate including greater than or equal to 85 mol % silica, a first surface, a second surface opposite the first surface, and a via extending through the silica-containing substrate from the first surface toward the second surface. The via includes a first diameter at the first surface wherein the first diameter is less than or equal to 100 μm, a second diameter at the second surface wherein the first diameter is less than or equal to 100 μm, and a via waist between the first surface and the second surface. The via waist has a waist diameter that is less than the first diameter and the second diameter such that a ratio between the waist diameter and each of the first diameter and the second diameter is less than or equal to 75%.

20 Claims, 18 Drawing Sheets

(51) Int. Cl.
  B23K 26/06      (2014.01)
  B23K 26/062     (2014.01)
  B23K 26/0622    (2014.01)
  B23K 26/36      (2014.01)
  B23K 26/53      (2014.01)
  B23K 26/55      (2014.01)
  B23K 26/402     (2014.01)
  B23K 26/00      (2014.01)
  B23K 26/073         (2006.01)
  B23K 26/064         (2014.01)
  H01L 23/48          (2006.01)
  H01L 23/538         (2006.01)
  B23K 103/00         (2006.01)
  H01L 21/48          (2006.01)
  H01L 23/15          (2006.01)
  H01L 23/498         (2006.01)

(52) U.S. Cl.
  CPC .......... B23K 26/062 (2015.10); B23K 26/402 (2013.01); C03C 15/00 (2013.01); B23K 26/064 (2015.10); B23K 26/0617 (2013.01); B23K 26/0622 (2015.10); B23K 26/0624 (2015.10); B23K 26/0626 (2013.01); B23K 26/0738 (2013.01); B23K 26/36 (2013.01); B23K 2103/54 (2018.08); H01L 21/486 (2013.01); H01L 23/15 (2013.01); H01L 23/481 (2013.01); H01L 23/49827 (2013.01); H01L 23/49838 (2013.01); H01L 23/5384 (2013.01); H05K 2201/09827 (2013.01); H05K 2201/09854 (2013.01)

(56) References Cited

U.S. PATENT DOCUMENTS

| | | |
|---|---|---|
| 237,571 A | 2/1881 | Meissier |
| 1,790,397 A | 1/1931 | Woods et al. |
| 2,682,134 A | 6/1954 | Stanley |
| 2,749,794 A | 6/1956 | O'Leary |
| 3,647,410 A | 3/1972 | Heaton et al. |
| 3,695,497 A | 10/1972 | Dear |
| 3,695,498 A | 10/1972 | Dear |
| 3,713,921 A * | 1/1973 | Fleischer .................. B26F 1/26 216/87 |
| 3,729,302 A | 4/1973 | Heaton |
| 3,775,084 A | 11/1973 | Heaton |
| 3,798,013 A | 3/1974 | Hasegawa et al. |
| 4,226,607 A | 10/1980 | Domken |
| 4,395,271 A | 7/1983 | Beall et al. |
| 4,441,008 A | 4/1984 | Chan |
| 4,546,231 A | 10/1985 | Gresser et al. |
| 4,547,836 A | 10/1985 | Anthony |
| 4,564,579 A | 1/1986 | Morita et al. |
| 4,646,308 A | 2/1987 | Kafka et al. |
| 4,764,930 A | 8/1988 | Bille et al. |
| 4,891,054 A | 1/1990 | Bricker et al. |
| 4,907,586 A | 3/1990 | Bille et al. |
| 4,918,751 A | 4/1990 | Pessot et al. |
| 4,929,065 A | 5/1990 | Hagerty et al. |
| 4,948,941 A | 8/1990 | Altman et al. |
| 5,022,959 A | 6/1991 | Itoh et al. |
| 5,035,918 A | 7/1991 | Vyas |
| 5,040,182 A | 8/1991 | Spinelli et al. |
| 5,089,062 A | 2/1992 | Pavlik et al. |
| 5,102,498 A | 4/1992 | Itoh et al. |
| 5,104,210 A | 4/1992 | Tokas |
| 5,108,857 A | 4/1992 | Kitayama et al. |
| 5,112,722 A | 5/1992 | Tsujino et al. |
| 5,114,834 A | 5/1992 | Nachshon |
| 5,166,493 A | 11/1992 | Inagawa et al. |
| 5,208,068 A | 5/1993 | Davis |
| 5,265,107 A | 11/1993 | Delfyett, Jr. |
| 5,314,522 A | 5/1994 | Kondo et al. |
| 5,374,291 A | 12/1994 | Yabe et al. |
| 5,400,350 A | 3/1995 | Galvanauskas |
| 5,434,875 A | 7/1995 | Rieger et al. |
| 5,436,925 A | 7/1995 | Lin et al. |
| 5,457,836 A | 10/1995 | Wiedeck |
| 5,493,096 A | 2/1996 | Koh |
| 5,553,093 A | 9/1996 | Ramaswamy et al. |
| 5,574,597 A | 11/1996 | Kataoka |
| 5,575,291 A | 11/1996 | Hayakawa et al. |
| 5,575,936 A | 11/1996 | Goldfarb |
| 5,586,138 A | 12/1996 | Yokoyama |
| 5,696,782 A | 12/1997 | Harter et al. |
| 5,736,709 A | 4/1998 | Neiheisel |
| 5,745,236 A | 4/1998 | Haga |
| 5,746,884 A | 5/1998 | Gupta et al. |
| 5,776,220 A | 7/1998 | Allaire et al. |
| 5,844,200 A | 12/1998 | Leader et al. |
| 5,879,424 A | 3/1999 | Nishii et al. |
| 5,909,284 A | 6/1999 | Nakamura |
| 5,919,607 A | 7/1999 | Lawandy |
| 5,933,230 A | 8/1999 | Imaino et al. |
| 5,965,043 A | 10/1999 | Noddin |
| 6,016,223 A | 1/2000 | Suzuki et al. |
| 6,016,324 A | 1/2000 | Rieger et al. |
| 6,055,829 A | 5/2000 | Witzmann et al. |
| 6,072,624 A | 6/2000 | Dixon et al. |
| 6,078,599 A | 6/2000 | Everage et al. |
| 6,120,131 A | 9/2000 | Murthy et al. |
| 6,140,243 A | 10/2000 | Wallace et al. |
| 6,143,382 A | 11/2000 | Koyama et al. |
| 6,156,030 A | 12/2000 | Neev |
| 6,160,835 A | 12/2000 | Kwon |
| 6,186,384 B1 | 2/2001 | Sawada |
| 6,210,401 B1 | 4/2001 | Lai |
| 6,224,713 B1 | 5/2001 | Hembree et al. |
| 6,234,755 B1 | 5/2001 | Bunker et al. |
| 6,256,328 B1 | 7/2001 | Delfyett et al. |
| 6,259,151 B1 | 7/2001 | Morrison |
| 6,259,512 B1 | 7/2001 | Mizouchi |
| 6,272,156 B1 | 8/2001 | Reed et al. |
| 6,301,932 B1 | 10/2001 | Allen et al. |
| 6,308,055 B1 | 10/2001 | Welland et al. |
| 6,319,867 B1 | 11/2001 | Chacon et al. |
| 6,322,958 B1 | 11/2001 | Hayashi |
| 6,338,901 B1 | 1/2002 | Veerasamy |
| 6,339,208 B1 | 1/2002 | Rockstroh et al. |
| 6,344,242 B1 | 2/2002 | Stolk et al. |
| 6,373,565 B1 | 4/2002 | Kafka et al. |
| 6,381,391 B1 | 4/2002 | Islam et al. |
| 6,391,213 B1 | 5/2002 | Homola |
| 6,396,856 B1 | 5/2002 | Sucha et al. |
| 6,399,914 B1 | 6/2002 | Troitski |
| 6,407,360 B1 | 6/2002 | Choo et al. |
| 6,420,088 B1 | 7/2002 | Angelopoulos et al. |
| 6,438,996 B1 | 8/2002 | Cuvelier |
| 6,445,491 B2 | 9/2002 | Sucha et al. |
| 6,449,301 B1 | 9/2002 | Wu et al. |
| 6,484,052 B1 | 11/2002 | Visuri et al. |
| 6,489,589 B1 | 12/2002 | Alexander |
| 6,501,578 B1 | 12/2002 | Bernstein et al. |
| 6,537,937 B1 | 3/2003 | Nishizawa et al. |
| 6,552,301 B2 | 4/2003 | Herman et al. |
| 6,563,079 B1 | 5/2003 | Umetsu et al. |
| 6,573,026 B1 | 6/2003 | Aitken et al. |
| 6,592,703 B1 | 7/2003 | Habeck et al. |
| 6,635,849 B1 | 10/2003 | Okawa et al. |
| 6,635,850 B2 | 10/2003 | Amako et al. |
| 6,720,519 B2 | 4/2004 | Liu et al. |
| 6,729,161 B1 | 5/2004 | Miura et al. |
| 6,737,345 B1 | 5/2004 | Lin et al. |
| 6,744,009 B1 | 6/2004 | Xuan et al. |
| 6,754,429 B2 | 6/2004 | Borrelli et al. |
| 6,787,732 B1 | 9/2004 | Xuan et al. |
| 6,794,605 B2 | 9/2004 | Park et al. |
| 6,800,237 B1 | 10/2004 | Yamamoto et al. |
| 6,800,831 B1 | 10/2004 | Hoetzel |
| 6,906,795 B2 | 6/2005 | Goto et al. |
| 6,958,094 B2 | 10/2005 | Ohmi et al. |

(56) References Cited

U.S. PATENT DOCUMENTS

| | | |
|---|---|---|
| 6,990,285 B2 | 1/2006 | Schroeder et al. |
| 6,992,026 B2 | 1/2006 | Fukuyo et al. |
| 6,992,030 B2 | 1/2006 | Paulson |
| 7,008,817 B2 | 3/2006 | Kim et al. |
| 7,009,138 B2 | 3/2006 | Amako et al. |
| 7,019,257 B2 | 3/2006 | Stevens |
| 7,033,519 B2 | 4/2006 | Taylor et al. |
| 7,043,072 B2 | 5/2006 | Goto et al. |
| 7,057,135 B2 | 6/2006 | Li |
| 7,084,073 B2 | 8/2006 | Lee et al. |
| 7,211,899 B2 | 5/2007 | Taniguchi et al. |
| 7,337,540 B2 | 3/2008 | Kurosawa |
| 7,353,829 B1 | 4/2008 | Wachter et al. |
| 7,407,889 B2 | 8/2008 | Tsunetomo et al. |
| 7,511,886 B2 | 3/2009 | Schultz et al. |
| 7,528,967 B2 | 5/2009 | Okawauchi et al. |
| 7,534,734 B2 | 5/2009 | Ellison |
| 7,535,634 B1 | 5/2009 | Savchenkov et al. |
| 7,626,665 B2 | 12/2009 | Koike |
| 7,633,033 B2 | 12/2009 | Thomas et al. |
| 7,642,483 B2 | 1/2010 | You et al. |
| 7,649,153 B2 | 1/2010 | Haight et al. |
| 7,683,370 B2 | 3/2010 | Kugimiya et al. |
| 7,726,532 B2 | 6/2010 | Gonoe |
| 7,749,809 B2 | 7/2010 | How et al. |
| 7,763,559 B2 | 7/2010 | Kurachi et al. |
| 7,772,115 B2 | 8/2010 | Hiatt |
| 7,777,275 B2 | 8/2010 | Lee |
| 7,836,727 B2 | 11/2010 | Nishiyama |
| 7,880,117 B2 | 2/2011 | Li et al. |
| 7,981,810 B1 | 7/2011 | Subramonium et al. |
| 7,994,503 B2 | 8/2011 | Hino et al. |
| 8,007,913 B2 | 8/2011 | Coppola et al. |
| 8,021,950 B1 | 9/2011 | Abadeer et al. |
| 8,104,385 B2 | 1/2012 | Hayashi et al. |
| 8,118,971 B2 | 2/2012 | Hori et al. |
| 8,119,462 B2 | 2/2012 | Takasawa et al. |
| 8,132,427 B2 | 3/2012 | Brown et al. |
| 8,163,649 B2 | 4/2012 | Koike et al. |
| 8,168,514 B2 | 5/2012 | Garner et al. |
| 8,245,539 B2 | 8/2012 | Lu et al. |
| 8,245,540 B2 | 8/2012 | Abramov et al. |
| 8,257,603 B2 | 9/2012 | Logunov et al. |
| 8,269,138 B2 | 9/2012 | Garner et al. |
| 8,283,595 B2 | 10/2012 | Fukuyo et al. |
| 8,292,141 B2 | 10/2012 | Cox |
| 8,296,066 B2 | 10/2012 | Zhao et al. |
| 8,303,754 B2 | 11/2012 | Higuchi |
| 8,307,672 B2 | 11/2012 | Hidaka et al. |
| 8,327,666 B2 | 12/2012 | Harvey et al. |
| 8,338,957 B2 | 12/2012 | Nilsson |
| 8,341,976 B2 | 1/2013 | Dejneka et al. |
| 8,347,651 B2 | 1/2013 | Abramov et al. |
| 8,358,888 B2 | 1/2013 | Ramachandran |
| 8,384,083 B2 | 2/2013 | Mori et al. |
| 8,411,459 B2 | 4/2013 | Yu et al. |
| 8,444,906 B2 | 5/2013 | Lee et al. |
| 8,448,471 B2 | 5/2013 | Kumatani et al. |
| 8,455,378 B2 | 6/2013 | Yanase et al. |
| 8,482,189 B2 | 7/2013 | Goto et al. |
| 8,518,280 B2 | 8/2013 | Hsu et al. |
| 8,531,679 B2 | 9/2013 | Scheiner |
| 8,533,942 B2 | 9/2013 | Ohashi et al. |
| 8,535,997 B2 | 9/2013 | Kawakami et al. |
| 8,549,881 B2 | 10/2013 | Brown et al. |
| 8,584,354 B2 | 11/2013 | Cornejo et al. |
| 8,584,490 B2 | 11/2013 | Garner et al. |
| 8,592,716 B2 | 11/2013 | Abramov et al. |
| 8,604,380 B2 | 12/2013 | Howerton et al. |
| 8,607,590 B2 | 12/2013 | Glaesemann et al. |
| 8,616,024 B2 | 12/2013 | Cornejo et al. |
| 8,635,887 B2 | 1/2014 | Black et al. |
| 8,643,129 B2 | 2/2014 | Laming et al. |
| 8,670,182 B2 | 3/2014 | Tanida et al. |
| 8,680,489 B2 | 3/2014 | Martinez et al. |
| 8,685,838 B2 | 4/2014 | Fukuyo et al. |
| 8,697,228 B2 | 4/2014 | Carre et al. |
| 8,699,037 B2 | 4/2014 | Cox |
| 8,720,228 B2 | 5/2014 | Li |
| 8,742,588 B2 | 6/2014 | Nilsson et al. |
| 8,796,165 B2 | 8/2014 | Ellison et al. |
| 8,826,696 B2 | 9/2014 | Brown et al. |
| 8,835,335 B2 | 9/2014 | Murata et al. |
| 8,852,698 B2 | 10/2014 | Fukumitsu |
| 8,871,641 B2 | 10/2014 | Nilsson |
| 8,873,067 B2 | 10/2014 | Lee et al. |
| 8,887,529 B2 | 11/2014 | Lu et al. |
| 8,916,798 B2 | 12/2014 | Pluss |
| 8,943,855 B2 | 2/2015 | Gomez et al. |
| 8,971,053 B2 | 3/2015 | Kariya et al. |
| 8,980,727 B1 | 3/2015 | Lei et al. |
| 8,993,465 B2 | 3/2015 | Ellison et al. |
| 8,999,179 B2 | 4/2015 | Yu et al. |
| 9,023,421 B2 | 5/2015 | Nakashima |
| 9,024,443 B2 | 5/2015 | Inaba et al. |
| 9,093,381 B2 | 7/2015 | Barriere et al. |
| 9,138,913 B2 | 9/2015 | Arai et al. |
| 9,140,539 B2 | 9/2015 | Scheiner |
| 9,227,868 B2 | 1/2016 | Matsumoto et al. |
| 9,232,652 B2 | 1/2016 | Fushie et al. |
| 9,263,300 B2 | 2/2016 | Tsai et al. |
| 9,278,886 B2 | 3/2016 | Boek et al. |
| 9,285,593 B1 * | 3/2016 | Laskin ................ G02B 27/095 |
| 9,290,407 B2 | 3/2016 | Barefoot et al. |
| 9,296,066 B2 | 3/2016 | Hosseini et al. |
| 9,296,646 B2 | 3/2016 | Burket et al. |
| 9,305,470 B2 | 4/2016 | Miki et al. |
| 9,321,680 B2 | 4/2016 | Chuang et al. |
| 9,324,791 B2 | 4/2016 | Tamemoto |
| 9,327,381 B2 | 5/2016 | Lee et al. |
| 9,346,706 B2 | 5/2016 | Bazemore et al. |
| 9,377,583 B2 | 6/2016 | Giaretta et al. |
| 9,425,125 B2 | 8/2016 | Shen |
| 9,442,377 B1 | 9/2016 | Ongayi et al. |
| 9,446,590 B2 | 9/2016 | Chen et al. |
| 9,481,598 B2 | 11/2016 | Bergh et al. |
| 9,517,963 B2 | 12/2016 | Marjanovic et al. |
| 9,676,046 B2 | 6/2017 | Hamada et al. |
| 9,745,220 B2 | 8/2017 | Burket et al. |
| 9,758,876 B2 | 9/2017 | Shorey et al. |
| 9,760,986 B2 | 9/2017 | Ramamurthy et al. |
| 9,815,730 B2 | 11/2017 | Marjanovic et al. |
| 9,832,868 B1 | 11/2017 | Wright et al. |
| 9,850,160 B2 | 12/2017 | Marjanovic et al. |
| 9,953,912 B2 | 4/2018 | Goers |
| 10,144,093 B2 | 12/2018 | Marjanovic et al. |
| 10,203,476 B2 | 2/2019 | Cui |
| 2001/0009250 A1 | 7/2001 | Herman et al. |
| 2002/0005805 A1 | 1/2002 | Ogura et al. |
| 2002/0041946 A1 | 4/2002 | Abe |
| 2002/0046997 A1 | 4/2002 | Nam et al. |
| 2002/0051563 A1 | 5/2002 | Goto et al. |
| 2002/0052125 A1 | 5/2002 | Shaffer et al. |
| 2002/0062563 A1 | 5/2002 | Koide et al. |
| 2002/0082466 A1 | 6/2002 | Han |
| 2002/0097486 A1 | 7/2002 | Yamaguchi et al. |
| 2002/0110639 A1 | 8/2002 | Bruns |
| 2002/0137344 A1 | 9/2002 | Jordan et al. |
| 2002/0180015 A1 | 12/2002 | Yamaguchi et al. |
| 2002/0182871 A1 | 12/2002 | Lu et al. |
| 2003/0006221 A1 | 1/2003 | Hong et al. |
| 2003/0007772 A1 | 1/2003 | Borrelli et al. |
| 2003/0045420 A1 | 3/2003 | Koyama et al. |
| 2003/0137056 A1 * | 7/2003 | Taniguchi .............. H05K 1/115 |
| | | 257/774 |
| 2003/0150839 A1 * | 8/2003 | Kobayashi .............. C03C 19/00 |
| | | 216/97 |
| 2003/0206651 A1 | 11/2003 | Goto et al. |
| 2003/0217568 A1 * | 11/2003 | Koyo .................. C03C 23/0025 |
| | | 65/105 |
| 2003/0235385 A1 * | 12/2003 | Taylor .................... G02B 6/136 |
| | | 385/129 |
| 2004/0000534 A1 | 1/2004 | Lipinski |
| 2004/0013951 A1 | 1/2004 | Wang |

(56) References Cited

U.S. PATENT DOCUMENTS

| | | |
|---|---|---|
| 2004/0022487 A1 | 2/2004 | Nagasaka et al. |
| 2004/0058476 A1 | 3/2004 | Enquist et al. |
| 2004/0061705 A1 | 4/2004 | Yoon et al. |
| 2004/0092105 A1 | 5/2004 | Lee et al. |
| 2004/0094524 A1 | 5/2004 | Stevens |
| 2004/0152229 A1 | 8/2004 | Najafi et al. |
| 2004/0188393 A1 | 9/2004 | Li et al. |
| 2004/0217455 A1 | 11/2004 | Shiono et al. |
| 2004/0221615 A1 | 11/2004 | Postupack et al. |
| 2004/0223704 A1* | 11/2004 | Fujii ............... G02B 6/4201 385/88 |
| 2004/0256619 A1 | 12/2004 | Nomura et al. |
| 2005/0009315 A1 | 1/2005 | Kim et al. |
| 2005/0023246 A1 | 2/2005 | McEntee et al. |
| 2005/0024743 A1 | 2/2005 | Camy-Peyret |
| 2005/0029238 A1 | 2/2005 | Chen |
| 2005/0033184 A1 | 2/2005 | Christoph |
| 2005/0079650 A1 | 4/2005 | Mancini et al. |
| 2005/0098458 A1 | 5/2005 | Gruetzmacher et al. |
| 2005/0098548 A1 | 5/2005 | Kobayashi et al. |
| 2005/0106874 A1 | 5/2005 | Matsui et al. |
| 2005/0112506 A1 | 5/2005 | Czech et al. |
| 2005/0115938 A1 | 6/2005 | Sawaki et al. |
| 2005/0142364 A1 | 6/2005 | Aitken |
| 2005/0142812 A1 | 6/2005 | Kurosawa |
| 2005/0158538 A1 | 7/2005 | Li |
| 2005/0202683 A1 | 9/2005 | Wang et al. |
| 2005/0266320 A1 | 12/2005 | Amemiya |
| 2005/0274702 A1 | 12/2005 | Deshi |
| 2006/0011593 A1 | 1/2006 | Fukuyo et al. |
| 2006/0012766 A1 | 1/2006 | Klosner et al. |
| 2006/0019814 A1 | 1/2006 | Baik et al. |
| 2006/0039160 A1* | 2/2006 | Cassarly ............ G02B 27/0944 362/551 |
| 2006/0109874 A1 | 5/2006 | Shiozaki et al. |
| 2006/0127679 A1 | 6/2006 | Gulati et al. |
| 2006/0151450 A1 | 7/2006 | You et al. |
| 2006/0192978 A1 | 8/2006 | Laguarta et al. |
| 2006/0194916 A1 | 8/2006 | Zhong et al. |
| 2006/0207976 A1 | 9/2006 | Bovatsek et al. |
| 2006/0219676 A1 | 10/2006 | Taylor et al. |
| 2006/0227440 A1 | 10/2006 | Gluckstad |
| 2006/0270232 A1 | 11/2006 | Kawamura et al. |
| 2006/0289410 A1 | 12/2006 | Morita et al. |
| 2006/0290232 A1 | 12/2006 | Fujita et al. |
| 2006/0292877 A1 | 12/2006 | Lake |
| 2007/0045779 A1 | 3/2007 | Hiatt |
| 2007/0051706 A1 | 3/2007 | Bovatsek et al. |
| 2007/0111390 A1 | 5/2007 | Komura et al. |
| 2007/0111480 A1 | 5/2007 | Maruyama et al. |
| 2007/0117044 A1 | 5/2007 | Ogihara et al. |
| 2007/0119831 A1 | 5/2007 | Kandt |
| 2007/0132977 A1 | 6/2007 | Komatsuda |
| 2007/0138151 A1 | 6/2007 | Tanaka et al. |
| 2007/0177116 A1 | 8/2007 | Amako |
| 2007/0181543 A1 | 8/2007 | Urairi et al. |
| 2007/0190340 A1 | 8/2007 | Coppola et al. |
| 2007/0202619 A1 | 8/2007 | Tamura et al. |
| 2007/0232028 A1 | 10/2007 | Lee et al. |
| 2007/0298529 A1 | 12/2007 | Maeda et al. |
| 2008/0000884 A1 | 1/2008 | Sugiura et al. |
| 2008/0099444 A1 | 5/2008 | Misawa et al. |
| 2008/0194109 A1 | 8/2008 | Ishibashi et al. |
| 2008/0206690 A1 | 8/2008 | Kennedy et al. |
| 2008/0212185 A1* | 9/2008 | Fuse ............... G02B 19/0052 359/558 |
| 2008/0245109 A1 | 10/2008 | Flemming et al. |
| 2008/0314883 A1 | 12/2008 | Juodkazis et al. |
| 2009/0013724 A1* | 1/2009 | Koyo ............... B23K 26/0093 65/31 |
| 2009/0029189 A1 | 1/2009 | Moriwaki et al. |
| 2009/0032510 A1* | 2/2009 | Ando ............... B23K 26/067 219/121.72 |
| 2009/0075087 A1 | 3/2009 | Xu et al. |
| 2009/0098351 A1 | 4/2009 | Kishi |
| 2009/0151996 A1 | 6/2009 | Mishima et al. |
| 2009/0176034 A1 | 7/2009 | Ruuttu et al. |
| 2009/0183764 A1 | 7/2009 | Meyer |
| 2009/0219491 A1* | 9/2009 | Williams ........... G02B 27/0927 353/37 |
| 2009/0242528 A1 | 10/2009 | Howerton et al. |
| 2009/0250446 A1 | 10/2009 | Sakamoto |
| 2009/0286091 A1* | 11/2009 | Danielson ............... C03C 17/06 428/426 |
| 2009/0294419 A1 | 12/2009 | Abramov et al. |
| 2009/0294422 A1 | 12/2009 | Lubatschowski et al. |
| 2009/0324899 A1 | 12/2009 | Feinstein et al. |
| 2010/0000259 A1 | 1/2010 | Ukrainczyk et al. |
| 2010/0015439 A1 | 1/2010 | Buether et al. |
| 2010/0015454 A1 | 1/2010 | Anderson et al. |
| 2010/0025387 A1 | 2/2010 | Arai et al. |
| 2010/0029460 A1 | 2/2010 | Shojiya et al. |
| 2010/0032087 A1 | 2/2010 | Takahashi et al. |
| 2010/0050692 A1 | 3/2010 | Logunov et al. |
| 2010/0068453 A1* | 3/2010 | Imai ............... C03C 15/00 428/131 |
| 2010/0080961 A1 | 4/2010 | Okamura et al. |
| 2010/0086741 A1 | 4/2010 | Bovatsek et al. |
| 2010/0086870 A1 | 4/2010 | Ogihara et al. |
| 2010/0089631 A1 | 4/2010 | Sakaguchi et al. |
| 2010/0089882 A1 | 4/2010 | Tamura |
| 2010/0102042 A1 | 4/2010 | Garner |
| 2010/0119808 A1 | 5/2010 | Li et al. |
| 2010/0119846 A1 | 5/2010 | Sawada |
| 2010/0129603 A1 | 5/2010 | Blick et al. |
| 2010/0133697 A1* | 6/2010 | Nilsson ............... B81C 1/00095 257/774 |
| 2010/0147813 A1 | 6/2010 | Lei et al. |
| 2010/0178732 A1 | 7/2010 | Wu et al. |
| 2010/0206008 A1 | 8/2010 | Harvey et al. |
| 2010/0252540 A1 | 10/2010 | Lei et al. |
| 2010/0252959 A1 | 10/2010 | Lei et al. |
| 2010/0276505 A1 | 11/2010 | Smith |
| 2010/0279067 A1 | 11/2010 | Sabia et al. |
| 2010/0279509 A1 | 11/2010 | Kim et al. |
| 2010/0284027 A1 | 11/2010 | Scheiner |
| 2010/0287991 A1 | 11/2010 | Brown et al. |
| 2010/0289115 A1 | 11/2010 | Akiyama et al. |
| 2010/0289186 A1 | 11/2010 | Longo et al. |
| 2010/0291353 A1 | 11/2010 | Dejneka et al. |
| 2010/0292068 A1 | 11/2010 | Takaya et al. |
| 2010/0307809 A1* | 12/2010 | Noda ............... H05K 3/4602 174/266 |
| 2010/0320179 A1 | 12/2010 | Morita et al. |
| 2010/0326138 A1 | 12/2010 | Kumatani et al. |
| 2011/0003619 A1 | 1/2011 | Fujii |
| 2011/0032467 A1 | 2/2011 | Koike |
| 2011/0045239 A1 | 2/2011 | Takaya et al. |
| 2011/0049764 A1 | 3/2011 | Lee et al. |
| 2011/0049765 A1 | 3/2011 | Li et al. |
| 2011/0088324 A1 | 4/2011 | Wessel |
| 2011/0100401 A1 | 5/2011 | Fiorentini |
| 2011/0123787 A1 | 5/2011 | Tomamoto et al. |
| 2011/0132881 A1 | 6/2011 | Liu |
| 2011/0132883 A1 | 6/2011 | Sheng et al. |
| 2011/0183116 A1 | 7/2011 | Hung et al. |
| 2011/0187025 A1 | 8/2011 | Costin, Sr. |
| 2011/0189847 A1 | 8/2011 | Tsai et al. |
| 2011/0195360 A1 | 8/2011 | Flemming et al. |
| 2011/0201197 A1* | 8/2011 | Nilsson ............... H01L 23/481 438/638 |
| 2011/0204528 A1 | 8/2011 | Matsutani et al. |
| 2011/0229687 A1 | 9/2011 | Gu et al. |
| 2011/0240611 A1 | 10/2011 | Sandstroem |
| 2011/0248405 A1 | 10/2011 | Li et al. |
| 2011/0256344 A1* | 10/2011 | Ono ............... B23K 26/40 428/131 |
| 2011/0259373 A1 | 10/2011 | Hotta et al. |
| 2011/0259860 A1* | 10/2011 | Bass ............... B23K 26/40 219/121.72 |
| 2011/0277507 A1 | 11/2011 | Lu et al. |
| 2011/0300908 A1 | 12/2011 | Grespan et al. |

(56) References Cited

U.S. PATENT DOCUMENTS

| | | |
|---|---|---|
| 2011/0308942 A1 | 12/2011 | Liu et al. |
| 2011/0316561 A1 | 12/2011 | Tinsley et al. |
| 2011/0318555 A1 | 12/2011 | Bookbinder et al. |
| 2011/0318561 A1 | 12/2011 | Murata et al. |
| 2012/0013196 A1 | 1/2012 | Kim et al. |
| 2012/0017642 A1 | 1/2012 | Teranishi et al. |
| 2012/0047951 A1 | 3/2012 | Dannoux et al. |
| 2012/0047956 A1 | 3/2012 | Li |
| 2012/0048604 A1* | 3/2012 | Cornejo ............... C03C 21/002 174/258 |
| 2012/0050692 A1 | 3/2012 | Gollier |
| 2012/0052302 A1 | 3/2012 | Matusick et al. |
| 2012/0061440 A1 | 3/2012 | Roell |
| 2012/0064306 A1 | 3/2012 | Kang et al. |
| 2012/0092681 A1 | 4/2012 | Cox |
| 2012/0103018 A1 | 5/2012 | Lu et al. |
| 2012/0105095 A1 | 5/2012 | Bryant et al. |
| 2012/0111057 A1 | 5/2012 | Barefoot et al. |
| 2012/0125892 A1 | 5/2012 | Shimoi et al. |
| 2012/0125893 A1* | 5/2012 | Shimoi ............... B23K 26/0853 216/87 |
| 2012/0129359 A1 | 5/2012 | Shimoi et al. |
| 2012/0130004 A1 | 5/2012 | Xu et al. |
| 2012/0131958 A1 | 5/2012 | Shimoi et al. |
| 2012/0131962 A1 | 5/2012 | Mitsugi et al. |
| 2012/0135177 A1 | 5/2012 | Cornejo et al. |
| 2012/0135195 A1 | 5/2012 | Glaesemann et al. |
| 2012/0135607 A1 | 5/2012 | Shimoi et al. |
| 2012/0135608 A1 | 5/2012 | Shimoi et al. |
| 2012/0135852 A1 | 5/2012 | Ellison et al. |
| 2012/0135853 A1 | 5/2012 | Amin et al. |
| 2012/0141668 A1 | 6/2012 | Nakashima |
| 2012/0142136 A1 | 6/2012 | Horning et al. |
| 2012/0145331 A1 | 6/2012 | Gomez et al. |
| 2012/0168412 A1* | 7/2012 | Hooper ................. B23K 26/70 219/121.69 |
| 2012/0196071 A1 | 8/2012 | Cornejo et al. |
| 2012/0205356 A1 | 8/2012 | Pluess |
| 2012/0211923 A1 | 8/2012 | Garner et al. |
| 2012/0214006 A1 | 8/2012 | Chen et al. |
| 2012/0234049 A1 | 9/2012 | Bolton |
| 2012/0234807 A1 | 9/2012 | Sercel et al. |
| 2012/0235969 A1* | 9/2012 | Burns ................. B81C 1/00095 345/211 |
| 2012/0241919 A1 | 9/2012 | Mitani |
| 2012/0255935 A1 | 10/2012 | Kakui et al. |
| 2012/0261697 A1 | 10/2012 | Margalit et al. |
| 2012/0276483 A1 | 11/2012 | Ogihara et al. |
| 2012/0276743 A1 | 11/2012 | Won et al. |
| 2012/0299203 A1 | 11/2012 | Sugo et al. |
| 2012/0299219 A1 | 11/2012 | Shimoi et al. |
| 2012/0302139 A1 | 11/2012 | Darcangelo et al. |
| 2012/0308803 A1 | 12/2012 | Dejneka et al. |
| 2013/0019637 A1 | 1/2013 | Sol et al. |
| 2013/0029092 A1* | 1/2013 | Wakioka ............... H05K 3/4038 428/131 |
| 2013/0034688 A1 | 2/2013 | Koike et al. |
| 2013/0044371 A1 | 2/2013 | Rupp et al. |
| 2013/0050226 A1 | 2/2013 | Shenoy et al. |
| 2013/0061636 A1 | 3/2013 | Imai et al. |
| 2013/0068736 A1 | 3/2013 | Mielke et al. |
| 2013/0075480 A1 | 3/2013 | Yokogi et al. |
| 2013/0078891 A1 | 3/2013 | Lee et al. |
| 2013/0089701 A1* | 4/2013 | Hooper ................. B23K 26/00 428/131 |
| 2013/0091897 A1 | 4/2013 | Fujii et al. |
| 2013/0105213 A1 | 5/2013 | Hu et al. |
| 2013/0118793 A1 | 5/2013 | Teshima et al. |
| 2013/0122264 A1 | 5/2013 | Fujii et al. |
| 2013/0126573 A1* | 5/2013 | Hosseini ............ B23K 26/0622 225/2 |
| 2013/0129947 A1 | 5/2013 | Harvey et al. |
| 2013/0133367 A1 | 5/2013 | Abramov et al. |
| 2013/0135745 A1 | 5/2013 | Tanida et al. |
| 2013/0143416 A1 | 6/2013 | Norval |
| 2013/0149434 A1 | 6/2013 | Oh et al. |
| 2013/0149494 A1 | 6/2013 | Koike et al. |
| 2013/0163801 A1 | 6/2013 | Ha et al. |
| 2013/0167590 A1 | 7/2013 | Teranishi et al. |
| 2013/0174607 A1 | 7/2013 | Wootton et al. |
| 2013/0174610 A1 | 7/2013 | Teranishi et al. |
| 2013/0180285 A1 | 7/2013 | Kariya |
| 2013/0180665 A2 | 7/2013 | Gomez et al. |
| 2013/0189806 A1 | 7/2013 | Hoshino |
| 2013/0192305 A1 | 8/2013 | Black et al. |
| 2013/0205835 A1 | 8/2013 | Giaretta et al. |
| 2013/0209731 A1 | 8/2013 | Nattermann et al. |
| 2013/0210245 A1* | 8/2013 | Jackl ..................... H05K 1/115 439/64 |
| 2013/0213467 A1* | 8/2013 | Nattermann .......... H01L 21/486 136/256 |
| 2013/0220982 A1 | 8/2013 | Thomas et al. |
| 2013/0221053 A1 | 8/2013 | Zhang |
| 2013/0224439 A1 | 8/2013 | Zhang et al. |
| 2013/0224492 A1 | 8/2013 | Bookbinder et al. |
| 2013/0228918 A1 | 9/2013 | Chen et al. |
| 2013/0247615 A1* | 9/2013 | Boek .................... B23K 26/402 65/29.1 |
| 2013/0255779 A1 | 10/2013 | Aitken et al. |
| 2013/0266757 A1 | 10/2013 | Giron et al. |
| 2013/0270240 A1 | 10/2013 | Kondo |
| 2013/0280495 A1 | 10/2013 | Matsumoto |
| 2013/0288010 A1 | 10/2013 | Akarapu et al. |
| 2013/0291598 A1 | 11/2013 | Saito et al. |
| 2013/0312460 A1 | 11/2013 | Kunishi et al. |
| 2013/0323469 A1 | 12/2013 | Abramov et al. |
| 2013/0330515 A1 | 12/2013 | Oh et al. |
| 2013/0334185 A1 | 12/2013 | Nomaru |
| 2013/0337599 A1 | 12/2013 | Yun |
| 2013/0340480 A1 | 12/2013 | Nattermann et al. |
| 2014/0015121 A1* | 1/2014 | Koizumi ................. H01L 23/15 257/734 |
| 2014/0027951 A1 | 1/2014 | Srinivas et al. |
| 2014/0034374 A1 | 2/2014 | Cornejo et al. |
| 2014/0034730 A1 | 2/2014 | Lee |
| 2014/0042202 A1 | 2/2014 | Lee |
| 2014/0044143 A1* | 2/2014 | Clarkson ............ G02B 6/02361 372/72 |
| 2014/0047957 A1 | 2/2014 | Wu |
| 2014/0054618 A1 | 2/2014 | Li |
| 2014/0654618 | 2/2014 | Li |
| 2014/0102146 A1 | 4/2014 | Saito et al. |
| 2014/0110040 A1 | 4/2014 | Cok |
| 2014/0113797 A1 | 4/2014 | Yamada et al. |
| 2014/0116091 A1 | 5/2014 | Chuang et al. |
| 2014/0133119 A1 | 5/2014 | Kariya et al. |
| 2014/0141217 A1 | 5/2014 | Gulati et al. |
| 2014/0147623 A1 | 5/2014 | Shorey et al. |
| 2014/0147624 A1 | 5/2014 | Streltsov et al. |
| 2014/0154439 A1 | 6/2014 | Demartino et al. |
| 2014/0165652 A1 | 6/2014 | Saito |
| 2014/0166199 A1 | 6/2014 | Bellman et al. |
| 2014/0170378 A1 | 6/2014 | Bellman et al. |
| 2014/0174131 A1 | 6/2014 | Saito et al. |
| 2014/0199519 A1* | 7/2014 | Schillinger ............ B23K 26/53 428/155 |
| 2014/0216108 A1 | 8/2014 | Wiegel et al. |
| 2014/0231390 A1* | 8/2014 | Nukaga ................... C03C 15/00 216/94 |
| 2014/0235796 A1 | 8/2014 | Ogihara et al. |
| 2014/0242375 A1 | 8/2014 | Mauro et al. |
| 2014/0254004 A1 | 9/2014 | Wooder et al. |
| 2014/0290310 A1 | 10/2014 | Green |
| 2014/0300728 A1 | 10/2014 | Drescher et al. |
| 2014/0320947 A1 | 10/2014 | Egerton |
| 2014/0333929 A1 | 11/2014 | Sung et al. |
| 2014/0339207 A1 | 11/2014 | Sugiyama et al. |
| 2014/0340730 A1 | 11/2014 | Bergh et al. |
| 2014/0342897 A1 | 11/2014 | Amin et al. |
| 2014/0347083 A1 | 11/2014 | Bryant et al. |
| 2014/0361463 A1 | 12/2014 | Desimone et al. |
| 2014/0376006 A1 | 12/2014 | Scheiner |
| 2015/0021513 A1 | 1/2015 | Kim et al. |

(56) References Cited

U.S. PATENT DOCUMENTS

| | | | |
|---|---|---|---|
| 2015/0027757 A1* | 1/2015 | Shin | H05K 3/107 174/255 |
| 2015/0036065 A1 | 2/2015 | Yousefpor et al. | |
| 2015/0037553 A1 | 2/2015 | Mauro | |
| 2015/0038313 A1 | 2/2015 | Hosseini | |
| 2015/0051060 A1 | 2/2015 | Ellison et al. | |
| 2015/0054136 A1 | 2/2015 | Ebefors et al. | |
| 2015/0060402 A1* | 3/2015 | Burkett | B23K 26/55 216/41 |
| 2015/0075221 A1 | 3/2015 | Kawaguchi et al. | |
| 2015/0075222 A1 | 3/2015 | Mader | |
| 2015/0093908 A1 | 4/2015 | Reddy | |
| 2015/0102498 A1 | 4/2015 | Enicks et al. | |
| 2015/0110442 A1 | 4/2015 | Zimmel et al. | |
| 2015/0118522 A1 | 4/2015 | Hosseini | |
| 2015/0136743 A1 | 5/2015 | Hosseini | |
| 2015/0140241 A1 | 5/2015 | Hosseini | |
| 2015/0140299 A1 | 5/2015 | Ellison et al. | |
| 2015/0151380 A1 | 6/2015 | Hosseini | |
| 2015/0158120 A1 | 6/2015 | Courvoisier et al. | |
| 2015/0165548 A1 | 6/2015 | Marjanovic et al. | |
| 2015/0165560 A1 | 6/2015 | Hackert et al. | |
| 2015/0165562 A1 | 6/2015 | Marjanovic et al. | |
| 2015/0165563 A1 | 6/2015 | Manley et al. | |
| 2015/0166391 A1 | 6/2015 | Marjanovic et al. | |
| 2015/0166393 A1 | 6/2015 | Marjanovic et al. | |
| 2015/0166394 A1 | 6/2015 | Marjanovic et al. | |
| 2015/0166395 A1* | 6/2015 | Marjanovic | B23K 26/0613 428/131 |
| 2015/0166396 A1* | 6/2015 | Marjanovic | B23K 26/04 428/137 |
| 2015/0166397 A1 | 6/2015 | Marjanovic et al. | |
| 2015/0173191 A1 | 6/2015 | Takahashi | |
| 2015/0183679 A1 | 7/2015 | Saito | |
| 2015/0232369 A1 | 8/2015 | Marjanovic et al. | |
| 2015/0274583 A1 | 10/2015 | An et al. | |
| 2015/0299018 A1 | 10/2015 | Bhuyan et al. | |
| 2015/0306847 A1 | 10/2015 | Bellman et al. | |
| 2015/0329415 A1 | 11/2015 | Bellman et al. | |
| 2015/0360991 A1 | 12/2015 | Grundmueller et al. | |
| 2015/0367442 A1 | 12/2015 | Bovatsek et al. | |
| 2015/0368145 A1 | 12/2015 | Senshu et al. | |
| 2015/0376050 A1 | 12/2015 | Nakamura et al. | |
| 2016/0008927 A1 | 1/2016 | Grundmueller et al. | |
| 2016/0009066 A1 | 1/2016 | Nieber et al. | |
| 2016/0023922 A1 | 1/2016 | Addiego et al. | |
| 2016/0026842 A1 | 1/2016 | Withers et al. | |
| 2016/0031745 A1 | 2/2016 | Ortner et al. | |
| 2016/0035587 A1* | 2/2016 | Keech | B06B 1/02 216/90 |
| 2016/0059359 A1* | 3/2016 | Krueger | B23K 26/0006 65/29.1 |
| 2016/0060156 A1 | 3/2016 | Krueger et al. | |
| 2016/0102009 A1 | 4/2016 | Boek et al. | |
| 2016/0107925 A1 | 4/2016 | Burket et al. | |
| 2016/0145149 A1 | 5/2016 | Burket et al. | |
| 2016/0152516 A1 | 6/2016 | Bazemore et al. | |
| 2016/0166395 A9 | 6/2016 | Weiman | |
| 2016/0199944 A1 | 7/2016 | Hosseini | |
| 2016/0200621 A1* | 7/2016 | N'Gom | B23K 26/0622 428/192 |
| 2016/0201474 A1 | 7/2016 | Slavens et al. | |
| 2016/0204126 A1 | 7/2016 | Amano | |
| 2016/0208387 A1 | 7/2016 | Liu et al. | |
| 2016/0219704 A1* | 7/2016 | Vandemeer | H05K 1/115 |
| 2016/0237571 A1 | 8/2016 | Liu et al. | |
| 2016/0280580 A1 | 9/2016 | Bohme | |
| 2016/0282584 A1 | 9/2016 | Cui | |
| 2016/0289669 A1 | 10/2016 | Fan et al. | |
| 2016/0290791 A1 | 10/2016 | Buono et al. | |
| 2016/0305764 A1 | 10/2016 | Cui et al. | |
| 2016/0311717 A1 | 10/2016 | Nieber et al. | |
| 2016/0312365 A1 | 10/2016 | Cordonier et al. | |
| 2016/0322291 A1 | 11/2016 | Goers | |
| 2016/0327744 A1 | 11/2016 | Giaretta et al. | |
| 2016/0334203 A1 | 11/2016 | Cui et al. | |
| 2016/0351410 A1 | 12/2016 | Fu et al. | |
| 2016/0352023 A1 | 12/2016 | Dang et al. | |
| 2016/0362331 A1 | 12/2016 | Castle et al. | |
| 2016/0368100 A1 | 12/2016 | Marjanovic et al. | |
| 2017/0002601 A1 | 1/2017 | Bergh et al. | |
| 2017/0008122 A1 | 1/2017 | Wieland et al. | |
| 2017/0011914 A1 | 1/2017 | Sumant et al. | |
| 2017/0029957 A1 | 2/2017 | Moon et al. | |
| 2017/0036419 A1 | 2/2017 | Adib et al. | |
| 2017/0103249 A1 | 4/2017 | Jin et al. | |
| 2017/0119891 A1 | 5/2017 | Lal et al. | |
| 2017/0160077 A1 | 6/2017 | Featherstone et al. | |
| 2017/0169847 A1 | 6/2017 | Tamaki | |
| 2017/0228884 A1 | 8/2017 | Yoshida | |
| 2017/0252859 A1* | 9/2017 | Kumkar | B23K 26/06 |
| 2017/0276951 A1* | 9/2017 | Kumkar | G02B 27/0944 |
| 2017/0358447 A1* | 12/2017 | Tsunetomo | H01L 21/02422 |
| 2017/0363417 A1 | 12/2017 | Cui et al. | |
| 2017/0372899 A1 | 12/2017 | Yang et al. | |
| 2018/0005922 A1 | 1/2018 | Levesque, Jr. et al. | |
| 2018/0033128 A1 | 2/2018 | Sobieranski et al. | |
| 2018/0057390 A1 | 3/2018 | Hackert et al. | |
| 2018/0062342 A1* | 3/2018 | Comstock, II | B23K 26/0665 |
| 2018/0068868 A1 | 3/2018 | Jaramillo et al. | |
| 2018/0093914 A1 | 4/2018 | Akarapu et al. | |
| 2018/0215647 A1 | 8/2018 | Ortner et al. | |
| 2018/0340262 A1* | 11/2018 | Hiranuma | C23F 1/16 |
| 2018/0342450 A1* | 11/2018 | Huang | H01L 23/15 |
| 2018/0342451 A1 | 11/2018 | Dahlberg et al. | |
| 2019/0012514 A1 | 1/2019 | Jin et al. | |
| 2019/0185373 A1 | 6/2019 | Hu et al. | |
| 2020/0156990 A1 | 5/2020 | Sakade et al. | |

FOREIGN PATENT DOCUMENTS

| | | |
|---|---|---|
| CA | 2530607 A1 | 4/2005 |
| CN | 1096936 A | 1/1995 |
| CN | 1196562 A | 10/1998 |
| CN | 2388062 Y | 7/2000 |
| CN | 1473087 A | 2/2004 |
| CN | 1485812 A | 3/2004 |
| CN | 1200793 C | 5/2005 |
| CN | 1619778 A | 5/2005 |
| CN | 1636912 A | 7/2005 |
| CN | 1735568 A | 2/2006 |
| CN | 1761378 A | 4/2006 |
| CN | 1845812 A | 10/2006 |
| CN | 1283409 C | 11/2006 |
| CN | 1967815 A | 5/2007 |
| CN | 101048255 A | 10/2007 |
| CN | 101238572 A | 8/2008 |
| CN | 101386466 A | 3/2009 |
| CN | 101427427 A | 5/2009 |
| CN | 100494879 C | 6/2009 |
| CN | 101502914 A | 8/2009 |
| CN | 100546004 C | 9/2009 |
| CN | 100555601 C | 10/2009 |
| CN | 101602148 A | 12/2009 |
| CN | 101610870 A | 12/2009 |
| CN | 201357287 Y | 12/2009 |
| CN | 101631739 A | 1/2010 |
| CN | 101637849 A | 2/2010 |
| CN | 201471092 U | 5/2010 |
| CN | 101722367 A | 6/2010 |
| CN | 101862907 A | 10/2010 |
| CN | 101965242 A | 2/2011 |
| CN | 102046545 A | 5/2011 |
| CN | 102060437 A | 5/2011 |
| CN | 102246292 A | 11/2011 |
| CN | 102304323 A | 1/2012 |
| CN | 102319960 A | 1/2012 |
| CN | 102326232 A | 1/2012 |
| CN | 102343631 A | 2/2012 |
| CN | 102356049 A | 2/2012 |
| CN | 102356050 A | 2/2012 |
| CN | 102428047 A | 4/2012 |
| CN | 102485405 A | 6/2012 |

(56) References Cited

FOREIGN PATENT DOCUMENTS

| | | | |
|---|---|---|---|
| CN | 102540474 A * | 7/2012 | |
| CN | 102574246 A | 7/2012 | |
| CN | 102585696 A | 7/2012 | |
| CN | 102596830 A | 7/2012 | |
| CN | 102649199 A | 8/2012 | |
| CN | 102672355 A | 9/2012 | |
| CN | 102795596 A | 11/2012 | |
| CN | 102898014 A | 1/2013 | |
| CN | 102916081 A | 2/2013 | |
| CN | 102923939 A | 2/2013 | |
| CN | 103013374 A | 4/2013 | |
| CN | 103079747 A | 5/2013 | |
| CN | 103143841 A | 6/2013 | |
| CN | 103159401 A | 6/2013 | |
| CN | 203021443 U | 6/2013 | |
| CN | 103237771 A | 8/2013 | |
| CN | 103273195 A | 9/2013 | |
| CN | 103316990 A | 9/2013 | |
| CN | 103359947 A | 10/2013 | |
| CN | 103359948 A | 10/2013 | |
| CN | 103460368 A | 12/2013 | |
| CN | 103531414 A | 1/2014 | |
| CN | 103534216 A | 1/2014 | |
| CN | 102300820 B | 2/2014 | |
| CN | 103746027 A | 4/2014 | |
| CN | 203509350 U | 4/2014 | |
| CN | 104344202 A | 2/2015 | |
| CN | 102958642 B | 7/2015 | |
| CN | 104897062 A | 9/2015 | |
| CN | 105246850 A | 1/2016 | |
| CN | 105392593 A | 3/2016 | |
| CN | 105693102 A | 6/2016 | |
| CN | 106132627 A | 11/2016 | |
| CN | 108191258 A | 6/2018 | |
| DE | 2231330 A1 | 1/1974 | |
| DE | 10322376 A1 | 12/2004 | |
| DE | 102006035555 A1 | 1/2008 | |
| DE | 102010003817 A1 | 10/2011 | |
| DE | 102011000768 A1 | 8/2012 | |
| DE | 102012010635 A1 | 11/2013 | |
| DE | 102012110971 A1 | 5/2014 | |
| DE | 102013103370 A1 | 10/2014 | |
| DE | 102013223637 A1 | 5/2015 | |
| DE | 102014113339 A1 * | 3/2016 | ......... C09C 23/0025 |
| EP | 247993 A1 | 12/1987 | |
| EP | 0270897 A1 | 6/1988 | |
| EP | 280918 A2 | 9/1988 | |
| EP | 0393381 A2 | 10/1990 | |
| EP | 0938946 A1 | 9/1999 | |
| EP | 1043110 A2 | 10/2000 | |
| EP | 1159104 A1 | 12/2001 | |
| EP | 1164113 A1 | 12/2001 | |
| EP | 1412131 A1 | 4/2004 | |
| EP | 1449810 A2 | 8/2004 | |
| EP | 1609559 A1 | 12/2005 | |
| EP | 1614665 A1 | 1/2006 | |
| EP | 1651943 A2 | 5/2006 | |
| EP | 1714730 A1 | 10/2006 | |
| EP | 1990125 A1 | 11/2008 | |
| EP | 2020273 A1 | 2/2009 | |
| EP | 2133170 A1 | 12/2009 | |
| EP | 2202545 A1 | 6/2010 | |
| EP | 2253414 A1 | 11/2010 | |
| EP | 2398746 A1 | 12/2011 | |
| EP | 2543065 A1 | 1/2013 | |
| EP | 2574983 A1 | 4/2013 | |
| EP | 2600397 A1 | 6/2013 | |
| EP | 2754524 A1 | 7/2014 | |
| EP | 2781296 A1 | 9/2014 | |
| EP | 2783784 A2 | 10/2014 | |
| EP | 2831913 A1 | 2/2015 | |
| EP | 2859984 A2 | 4/2015 | |
| EP | 2922793 A1 | 9/2015 | |
| EP | 3166372 A1 | 5/2017 | |
| EP | 3288906 A1 | 3/2018 | |
| FR | 2989294 A1 | 10/2013 | |
| GB | 1242172 A | 8/1971 | |
| GB | 2481190 A | 12/2011 | |
| IN | 201102390 | 3/2013 | |
| JP | 55130839 A | 10/1980 | |
| JP | 56-129261 A | 10/1981 | |
| JP | 56160893 A | 12/1981 | |
| JP | 60-220340 A | 11/1985 | |
| JP | 64-077001 A | 3/1989 | |
| JP | 01-179770 A | 7/1989 | |
| JP | 03252384 A | 11/1991 | |
| JP | 04-349132 A | 12/1992 | |
| JP | 06079486 A | 3/1994 | |
| JP | 06-318756 A | 11/1994 | |
| JP | 09-106243 A | 4/1997 | |
| JP | 10263873 A | 10/1998 | |
| JP | 11-197498 A | 7/1999 | |
| JP | 11-269683 A | 10/1999 | |
| JP | 11297703 A | 10/1999 | |
| JP | 11-330597 A | 11/1999 | |
| JP | 11-347758 A | 12/1999 | |
| JP | 2000-010289 A | 1/2000 | |
| JP | 2000301372 A | 10/2000 | |
| JP | 2000302488 A * | 10/2000 | ......... C03C 23/0025 |
| JP | 2001-106545 A | 4/2001 | |
| JP | 2001105398 A * | 4/2001 | |
| JP | 2001-138083 A | 5/2001 | |
| JP | 2002028799 A | 1/2002 | |
| JP | 2002154846 A | 5/2002 | |
| JP | 2002210730 A * | 7/2002 | ........... B23K 26/382 |
| JP | 2002-228818 A | 8/2002 | |
| JP | 2003017503 A | 1/2003 | |
| JP | 2003-062756 A | 3/2003 | |
| JP | 2003-114400 A | 4/2003 | |
| JP | 2003-154517 A | 5/2003 | |
| JP | 2003148931 A | 5/2003 | |
| JP | 2003-181668 A | 7/2003 | |
| JP | 2003-238178 A | 8/2003 | |
| JP | 2004-209675 A | 7/2004 | |
| JP | 2004190043 A | 7/2004 | |
| JP | 2004-255562 A | 9/2004 | |
| JP | 2004330236 A | 11/2004 | |
| JP | 2004351494 A * | 12/2004 | ............. B23K 26/53 |
| JP | 2004363212 A * | 12/2004 | |
| JP | 2005-000952 A | 1/2005 | |
| JP | 2005-019576 A | 1/2005 | |
| JP | 2005-074663 A | 3/2005 | |
| JP | 2005-104819 A | 4/2005 | |
| JP | 2005-205440 A | 8/2005 | |
| JP | 2005257339 A | 9/2005 | |
| JP | 2005-279755 A | 10/2005 | |
| JP | 2005-288503 A | 10/2005 | |
| JP | 2005306702 A * | 11/2005 | |
| JP | 2006-130691 A | 5/2006 | |
| JP | 3775250 B2 | 5/2006 | |
| JP | 3775410 B2 | 5/2006 | |
| JP | 2006161124 A | 6/2006 | |
| JP | 2006-248885 A | 9/2006 | |
| JP | 3823108 B2 | 9/2006 | |
| JP | 2006290630 A | 10/2006 | |
| JP | 2007-021548 A | 2/2007 | |
| JP | 2007042741 A | 2/2007 | |
| JP | 2007067031 A | 3/2007 | |
| JP | 2007-196277 A | 8/2007 | |
| JP | 2007-253203 A | 10/2007 | |
| JP | 2007-260896 A | 10/2007 | |
| JP | 2008-094641 A | 4/2008 | |
| JP | 2008-522950 A | 7/2008 | |
| JP | 2008156200 A * | 7/2008 | |
| JP | 2008156200 A | 7/2008 | |
| JP | 2008-247639 A | 10/2008 | |
| JP | 2008-273783 A | 11/2008 | |
| JP | 2008288577 A * | 11/2008 | |
| JP | 4349132 B2 | 10/2009 | |
| JP | 4418282 B2 | 2/2010 | |
| JP | 2010-046761 A | 3/2010 | |
| JP | 2010074017 A | 4/2010 | |
| JP | 2010-539288 A | 12/2010 | |
| JP | 4592855 B2 | 12/2010 | |

(56) References Cited

FOREIGN PATENT DOCUMENTS

| | | | |
|---|---|---|---|
| JP | 2011-011212 A | 1/2011 |
| JP | 2011037707 A * | 2/2011 |
| JP | 2011-049398 A | 3/2011 |
| JP | 4672689 B2 | 4/2011 |
| JP | 2011-517299 A | 6/2011 |
| JP | 2011143434 A | 7/2011 |
| JP | 2011178642 A * | 9/2011 |
| JP | 2011228517 A | 11/2011 |
| JP | 2011251872 A | 12/2011 |
| JP | 2012-024782 A | 2/2012 |
| JP | 2012-031018 A | 2/2012 |
| JP | 4880820 B2 | 2/2012 |
| JP | 2012028533 A | 2/2012 |
| JP | 2012-506837 | 3/2012 |
| JP | 2012-159749 A | 8/2012 |
| JP | 2012-517957 A | 8/2012 |
| JP | 2012-187618 A | 10/2012 |
| JP | 2013-007842 A | 1/2013 |
| JP | 2013-031879 A | 2/2013 |
| JP | 2013-043808 A | 3/2013 |
| JP | 2013-075802 A | 4/2013 |
| JP | 2013-091578 A | 5/2013 |
| JP | 2013-121908 A | 6/2013 |
| JP | 5274085 B2 | 8/2013 |
| JP | 2013-178371 A | 9/2013 |
| JP | 2013-187247 A | 9/2013 |
| JP | 2013-536081 A | 9/2013 |
| JP | 5300544 B2 | 9/2013 |
| JP | 2013-203630 A | 10/2013 |
| JP | 2013-203631 A | 10/2013 |
| JP | 2013-223886 A | 10/2013 |
| JP | 5318748 B2 | 10/2013 |
| JP | 2013220958 A * | 10/2013 |
| JP | 2013-245153 A | 12/2013 |
| JP | 2015-501531 A | 1/2015 |
| JP | 2015-030040 A | 2/2015 |
| JP | 2015-129076 A | 7/2015 |
| JP | 2015-519722 A | 7/2015 |
| JP | 2015146410 A * | 8/2015 |
| JP | 2016-508069 A | 3/2016 |
| KR | 1020020038707 A | 5/2002 |
| KR | 10-2002-0066005 A | 8/2002 |
| KR | 10-2009-0057161 A | 6/2009 |
| KR | 2010-0120297 A | 11/2010 |
| KR | 10-1020621 B1 | 3/2011 |
| KR | 20110046953 A | 5/2011 |
| KR | 2011-0121637 A | 11/2011 |
| KR | 10-2012-0015366 A | 2/2012 |
| KR | 10-1120471 B1 | 3/2012 |
| KR | 1159697 B1 | 6/2012 |
| KR | 10-2012-0074508 A | 7/2012 |
| KR | 2012-0102675 A | 9/2012 |
| KR | 2013-0031380 A | 3/2013 |
| KR | 10-1259349 B1 | 4/2013 |
| KR | 10-1269474 B1 | 5/2013 |
| KR | 2013-0079395 A | 7/2013 |
| KR | 10-2013-0111269 A | 10/2013 |
| KR | 10-2013-0124646 A | 11/2013 |
| KR | 10-1344368 B1 | 12/2013 |
| KR | 10-2014-0022980 A | 2/2014 |
| KR | 10-2014-0022981 A | 2/2014 |
| KR | 10-2014-0064220 A | 5/2014 |
| KR | 10-1423338 B1 | 7/2014 |
| KR | 10-2014-0112652 A | 9/2014 |
| KR | 2015-0016176 A | 2/2015 |
| TW | 200842313 A | 11/2008 |
| TW | 201027601 A | 7/2010 |
| TW | 201041027 A | 11/2010 |
| TW | 201041118 A | 11/2010 |
| TW | 201212755 A | 3/2012 |
| TW | 201226345 A | 7/2012 |
| TW | 201303259 A | 1/2013 |
| TW | 201311592 A | 3/2013 |
| TW | 201331136 A | 8/2013 |
| TW | 201339111 A | 10/2013 |
| TW | 201429897 A | 8/2014 |
| TW | 201610602 A | 3/2016 |
| TW | 201621267 A | 6/2016 |
| WO | 8902877 A1 | 4/1989 |
| WO | 98/21154 A1 | 5/1998 |
| WO | 99/29243 A1 | 6/1999 |
| WO | 99/63900 A1 | 12/1999 |
| WO | 00/51778 A1 | 9/2000 |
| WO | 2001033621 A2 | 5/2001 |
| WO | 2002/081142 A1 | 10/2002 |
| WO | 2003/007370 A1 | 1/2003 |
| WO | 03/11522 A1 | 2/2003 |
| WO | 03021004 A1 | 3/2003 |
| WO | 2004/110693 A1 | 12/2004 |
| WO | 2005031300 A2 | 4/2005 |
| WO | 2005033033 A1 | 4/2005 |
| WO | 2005034594 A1 | 4/2005 |
| WO | WO-2005034594 A1 * | 4/2005 ........... H03K 3/0023 |
| WO | 2006/073098 A1 | 7/2006 |
| WO | 2006/112822 A1 | 10/2006 |
| WO | 2007/094160 A1 | 8/2007 |
| WO | 2007/094233 A1 | 8/2007 |
| WO | 2007096958 A1 | 8/2007 |
| WO | 2008/012186 A1 | 1/2008 |
| WO | 2008/080182 A1 | 7/2008 |
| WO | 2008/102848 A1 | 8/2008 |
| WO | 2008110061 A1 | 9/2008 |
| WO | 2008/128612 A1 | 10/2008 |
| WO | 2009072810 A2 | 6/2009 |
| WO | 2009/114375 A2 | 9/2009 |
| WO | 2010/035736 A1 | 4/2010 |
| WO | 2010/096359 A1 | 8/2010 |
| WO | 2010087483 A1 | 8/2010 |
| WO | 2010/111609 A2 | 9/2010 |
| WO | 2010/129459 A2 | 11/2010 |
| WO | 2011/025908 A1 | 3/2011 |
| WO | 2011/056781 A1 | 5/2011 |
| WO | 2011109648 A1 | 9/2011 |
| WO | 2012/006736 A2 | 1/2012 |
| WO | 2012011230 A1 | 1/2012 |
| WO | 2012/027220 A2 | 3/2012 |
| WO | 2012060277 A1 | 5/2012 |
| WO | 2012/075072 A2 | 6/2012 |
| WO | 2012/108052 A1 | 8/2012 |
| WO | WO-2012161317 A1 * | 11/2012 ......... B81C 1/00087 |
| WO | 2012/166753 A1 | 12/2012 |
| WO | 2013/016157 A1 | 1/2013 |
| WO | 2013008344 A1 | 1/2013 |
| WO | 2013/022148 A1 | 2/2013 |
| WO | 2013/043173 A1 | 3/2013 |
| WO | 2013030848 A1 | 3/2013 |
| WO | 2013/084877 A1 | 6/2013 |
| WO | 2013/084879 A1 | 6/2013 |
| WO | 2013/134237 A1 | 9/2013 |
| WO | 2013/138802 A1 | 9/2013 |
| WO | 2013130718 A1 | 9/2013 |
| WO | 2013/147694 A1 | 10/2013 |
| WO | 2013/150990 A1 | 10/2013 |
| WO | 2013/153195 A1 | 10/2013 |
| WO | 2014/010490 A1 | 1/2014 |
| WO | 2014/012125 A1 | 1/2014 |
| WO | 2014/028022 A1 | 2/2014 |
| WO | 2014038326 A1 | 3/2014 |
| WO | 2014/064492 A1 | 5/2014 |
| WO | 2014/079478 A1 | 5/2014 |
| WO | 2014/079570 A1 | 5/2014 |
| WO | 2014/085660 A1 | 6/2014 |
| WO | 2014085663 A1 | 6/2014 |
| WO | 2014/111385 A1 | 7/2014 |
| WO | 2014/111794 A1 | 7/2014 |
| WO | 2014/121261 A1 | 8/2014 |
| WO | 2014148020 A1 | 9/2014 |
| WO | 2014/161535 A2 | 10/2014 |
| WO | 2014/161534 A3 | 11/2014 |
| WO | 2014205301 A2 | 12/2014 |
| WO | 2015/029286 A1 | 3/2015 |
| WO | 2015/077113 A1 | 5/2015 |
| WO | 2015/094898 A2 | 6/2015 |
| WO | 2015/095088 A1 | 6/2015 |

(56) References Cited

FOREIGN PATENT DOCUMENTS

| | | | |
|---|---|---|---|
| WO | 2015/095090 A1 | 6/2015 | |
| WO | 2015/095146 A1 | 6/2015 | |
| WO | 2015/095151 A2 | 6/2015 | |
| WO | 2015/100056 A1 | 7/2015 | |
| WO | 2015113023 A1 | 7/2015 | |
| WO | 2015/127583 A1 | 9/2015 | |
| WO | 2015157202 A1 | 10/2015 | |
| WO | 2016/005455 A1 | 1/2016 | |
| WO | 2016010954 A2 | 1/2016 | |
| WO | 2016/069821 A1 | 5/2016 | |
| WO | 2016089844 A1 | 6/2016 | |
| WO | 2016118683 A1 | 7/2016 | |
| WO | 2016/154284 A1 | 9/2016 | |
| WO | 2016/178966 A1 | 11/2016 | |
| WO | 2016176171 A1 | 11/2016 | |
| WO | 2016/201027 A2 | 12/2016 | |
| WO | 2017038075 A1 | 3/2017 | |
| WO | 2017062798 A1 | 4/2017 | |
| WO | 2017/127489 A1 | 7/2017 | |
| WO | 2017/210376 A1 | 12/2017 | |
| WO | WO-2018162385 A1 * | 9/2018 | ......... B23K 26/0006 |

OTHER PUBLICATIONS

Machine Translation of JP-2008288577-A, Nov. 2008 (Year: 2008).*
Machine Translation of JP-2011178642-A, Sep. 2011 (Year: 2011).*
Machine Translation of JP-2015146410-A, Aug. 2015 (Year: 2015).*
Machine Translation of WO 2018162385 A1, Sep. 2018 (Year: 2018).*
MicroChemicals, Silicon Wafers Quartz Wafers Glass Wafers, 2014 (no month) (Year: 2014).*
Swift Glass, Quartz/Fused Silica, Mar. 2016 (Year: 2016).*
Corning, Properties of VYCOR Code 7913 96% Silica High Temperature Glass, Apr. 2014 (Year: 2014).*
Kondo et al., Three-Dimensional Microdrilling of Glass by Multiphoton Process and Chemical Etching, 1999, Japanese Journal of Applied Physics, vol. 38, Part 2, No. 10A (Year: 1999).*
International Search Report and Written Opinion PCT/US2018/033814 dated Nov. 30, 2018, 12 pgs.
Intergrace, "Borosilicate glass: technical glass by Pulles & Hanique: Duan & Pyrex," Pulles & Hanique B.V., 2 pgs. Published Mar. 15, 2012, retrieved from: https://web.archive.org/web/20120315092729/http://www.pulleshanique.com/02_borosilicate-glass.htm.
Benjamin et al; "The Adhesion of Evaporated Metal Films on Glass"; Proc. Roy. Soc. A., vol. 261, (1962); pp. 516-531.
Borghi et al; "M2 Factor of Bessel-Gauss Beams" ; Optics Letters; vol. 22, No. 5; (1997) pp. 262-264.
Chen et al. "Development of an AOI system for chips with a hole on backside based on a frame imager" Proc. of SPIE vol. 9903, 2016. 6 pgs.
Iijima et al; "Resistivity Reduction by External Oxidation of Cu—Mn Alloy Films for Semiconductor Interconnect Application"; Journal of Vacuum Science & Technology B: Microelectronics and Nanometer Structures Processing, Measurement, and Phenomena, 27, 1963-1968 (2009).
Kiyama et al; "Examination of Etching Agent and Etching Mechanism on Femtosecond Laser Microfabrication of Channels Inside Vitreous Silica Substrates"; J. Phys. Chem. C, 2009, 113, pp. 11560-11566.
Koike et al; "P-33: Cu—Mn Electrodes for a-Si TFT and Its Electrical Characteristics" ; SID Symposium Digest of Technical Papers, 41:1, 1343-1346 (2010).
Koike et al; "Self-Forming Diffusion Barrier Layer in Cu—Mn Alloy Metallization"; Appl. Phys. Lett. 87, 041911-1-041911-3 (2005).
Ogutu et al; "Superconformal Filling of High Aspect Ratio Through Glass Vias (TGV) for Interposer Applications Using TNBT and NTBC Additives" ; Journal of the Electrochemical Society, 162 (9), D457-D464 (2015).
Yun et al; "P-23:The Contact Properties and TFT Structures of Al—IgZo TFTs Combined With Cu—Mn Alloy Electrodes"; SID Symposium Digest of Technical Papers 42:1, 1177-1180.
Shorey et al; "Progress and Application of Through Glass Via (TGV) Technology"; 2016 Pan Pacific Microelectronis Symposium, SMTA, Jan. 25, 2016; p. 1-6.
Shorey; "Leveraging Glass for Advanced Packaging and IoT" ; Apr. 21, 2016, Retrieved Form the Internet: URL:http://www.corning.com/media/worldwide/cdt/documents/iMAPs%20-%20Corning%20Overview%20-%204-21-16%20FINALpptx.pdf.
Siegman; "New Development in Laser Resonators" ; SPIE, vol. 1227, Optical Resonators (1990) pp. 2-14.
Thiele; "Relation Between Catalytic Activity and Size of Particle"; Industrial and Engineering Chemistry, vol. 31, No. 7; (1939) p. 916-920.
Topper et al; "3-D Thin Film Interposer Based on TGV (Through Glass Vias): An Alternative to Si-Interposer"; IEEE, Electronic Components and Technology Conference; 2010; p. 66-73.
U.S. Appl. No. 62/846,059; Cai et al. "Silicate Glass Compositions Useful for The Efficient Production of Through Glass Vias", filed May 10, 2019, 43 pgs.
U.S. Appl. No. 62/846102; Guo et al. "High Silicate Glass Articles Possessing Through Glass Vias and Methods of Making and Using Thereof" , filed May 10, 2019,36 pgs.
Wakayama et al. "Small size probe for inner profile measurement of pipes using optical fiber ring beam device" Proc. of SPIE vol. 8563, 2012. 7 pgs.
Wu et al, "A Study on Annealing Mechanisms With Different Manganese Contents in CuMn Alloy"; Journal of Alloys and Compounds, vol. 542, 2012, p. 118-123.
Zavyalov, "3D Hole Inspection Using Lens with High Field Curvature" Measurement Science Review, V. 15, No. 1, 2015. pp. 52-57.
Chen et al. "Projection ablation of glass-based single and arrayed microstructures using excimer laser", (2005) Optics and Laser Technology 37, 271-280.
Koyama et al. "Laser-micromachining for Ag Ion Exchanged Glasses," Second International Symposium on Laser Precision Microfabrication, Proc. SPE vol. 4426 (2002) 162-165.
Kruger et al "UV laser drilling of SiC for semiconductor device fabrication," J. Physics:Conference Series 59 (2007) 740-744.
Li et al. "Thick Polymer cover layers for laser micromachining of fine holes," Applied Physics A, Sep. 2005, vol. 81, Issues 4, pp. 753-758.
Madehow.com, Liquid Crystal Display (LCD), Jan. 29, 2006, https:/fweb.archive.org/web/20060129092154/http://www.madehow.com/Volume-1/Liquid-Crystal-Display-LCD.html; pp. 1-6.
Matsusaika et al. "Micro-machinability of silversodium ion-exchanged glass by UV nanosecond laser," J. Materials Processing Technology 202 (2008) 514-520.
Mukhina L; "Laser Pulse Damage on the Surface of Ion Exchange Treated Glass"; Soviet Journal of Glass Physics and Chemistry; vol. 19; No. 3; p. 269-272; (1993.
Ramil et al "Micromachining of glass by the third harmonic of nanosecond Nd:YVO4 laser", Applied Surface Science 255 (2009) p. 5557-5560.
Tsai et al. "Investigation of underwater laser drilling for brittle substrates," J. Materials Processing technology 209 (2009) 2838-2846.
Uzgiris et al. "Etched Laser Filament Tracks in Glasses and Polymers", (1973) Phys. Rev. A 7, 734-740.
Wlodarczyk et al. "The Impact of Graphite Coating and Wavelength on Picosecond Laser Machining of Optical Glasses,", 31st ICALEO Program Notes (2012). Paper M#309.
ASTM standard C770-16, entitled "Standard Test Method for Measurement of Glass Stress-Optical Coefficient,".
Handbook of Adhesives (3rd edition, Edited by Irving Skeist).
Miranda et al. "Ultraviolet-induced crosslinking of poly(vinyl alcohol) evaluated by principal component analysis of FTIR spectra"; Polym Int 50:1068-1072(2001 ).
Polavka et al. "Crosslinking of polymers by the effect of ultraviolet radiation crosslinking of poly(vinyl alcohol) in the presence ofterephthalic aldehyde"; 1980.

(56) References Cited

OTHER PUBLICATIONS

Tom Christiansen, Tami Erickson; Standard Operating Procedure: Spin-On-Glass, Surface Level Characterization (2000).
"EagleEtch" Product Brochure, EuropeTec USA Inc., pp. 1-8, Aug. 1, 2014.
"Pharos High-power femtosecond laser system" product brochure; Light Conversion, Vilnius, LT; Apr. 18, 2011, pp. 1-2.
"TruMicro 5000" Product Manual, Trumpf Laser GmbH + Co. KG, pp. 1-4, Aug. 2011.
"What is the difference between Ra and RMS?"; Harrison Electropolishing LP; (http://www.harrisonep.com/electropolishingra.html), Accessed Aug. 8, 2016.
Abakians et al."Evaporative Cutting of a Semitransparent Body With a Moving CW Laser", J. Heat Transfer 110(4a), 924-930 (Nov. 1, 1988) (7 pages) doi:10.1115/1.3250594.
Abramov et al., "Laser separation of chemically strengthened glass"; Physics Procedia 5 (2010) 285-290, Elsevier.; doi: 10.1016/j.phpro.2010.08.054.
Ahmed et al. "Display glass cutting by femtosecond laser induced single shot periodic void array" Applied Physics A: Materials Science and Proccessing vol. 93 No. 1 (2008) pp. 189-192.
Arimoto et al., "Imaging properties of axicon in a scanning optical system"; Applied Optics, Nov. 1, 1992, vol. 31, No. 31, pp. 6653-6657.
Bagchi et al. "Fast ion beams from intense, femtosecond laser irradiated nanostructured surfaces" Applied Physics B 88 (2007) p. 167-173.
Bhuyan et al. "Laser micro- and nanostructuring using femtosecond Besse! beams", Eur. Phys. J. Special Topics 199 (2011) p. 101-110.
Bhuyan et al. "Single shot high aspect ratio bulk nanostructuring of fused silica using chirp-controlled ultrafast laser Bessel beams" Applied Physics Letters 104 (2014) 021107.
Bhuyan et al. "Ultrafast Bessel beams for high aspect ratio taper free micromachining of glass" Proc. Of SPIE vol. 7728 77281V-1.
Bhuyan et al., "Femtosecond non-diffracting Bessel beams and controlled nanoscale ablation" by IEEE (2011).
Bhuyan et al., "High aspect ratio nanochannel machining using single shot femtosecond Bessel beams"; Applied Physics Letters 97, 081102 (2010); doi: 10.1063/1.3479419.
Bhuyan et al., "High aspect ratio taper-free microchannel fabrication using femtosecond Bessel beams"; Optics Express (2010) vol. 18, No. 2, pp. 566-574.
Case Design Guidelines for Apple Devices Release R5 (https://web.archive.org/web/20131006050442/https://developer.apple.com/resources/cases/Case-Design-Guidelines.pdf; archived on Oct. 6, 2013).
Chiao et al. 9. "Self-trapping of optical beams," Phys. Rev. Lett, vol. 13, No. 15, p. 479 (1964).
Corning Inc., "Corning(Registered) 1737 AM LCD Glass Substrates Material Information", issued Aug. 2002.
Corning Inc., "Corning(Registered) Eagle2000 TM AMLCD Glass Substrates Material Information", issued Apr. 2005.
Couairon et al. "Femtosecond filamentation in transparent media" Physics Reports 441 (2007) pp. 47-189.
Courvoisier et al. "Applications of femtosecond Bessel beams to laser ablation" Applied Physics A (2013) 112, p. 29-34.
Courvoisier et al. "Surface nanoprocessing with non-diffracting femtosecond Bessel beams" Optics Letters vol. 34 No. 20, (2009) pp. 3163-3165.
Cubeddu et al., "A compact time-resolved reflectance system for dual-wavelength multichannel assessment of tissue absorption and scattering"; Part of the SPIE Conference on Optical Tomography and Spectroscopy of Tissue III, San Jose, CA (Jan. 1999), SPIE vol. 3597, 0277-786X/99, pp. 450-455.
Cubeddu et al., "Compact tissue oximeter based on dual-wavelength multichannel time-resolved reflectance"; Applied Optics, vol. 38, No. 16, Jun. 1, 1999, pp. 3670-3680.
Ding et al., "High-resolution optical coherence tomography over a large depth range with an axicon lens"; Optic Letters, vol. 27, No. 4, pp. 243-245, Feb. 15, 2002, Optical Society of America.

Dong et al. "On-axis irradiance distribution of axicons illuminated by spherical wave", Optics & Laser Technology 39 (2007) 1258-1261.
Duocastella et al. "Bessel and annular beams for material processing", Laser Photonics Rev. 6, 607-621, 2012.
Dumin. "Exact solutions for nondiffracting beams I. The scaler theory" J. Opt. Soc. Am. A. 4(4) pp. 651-654.
Eaton et al. "Heat accumulation effects in femtosecond laser written waveguides with variable repetition rates", Opt. Exp. 5280, vol. 14, No. 23, Jun. 2006.
Gattass et al. "Micromachining of bulk glass with bursts of femtosecond laser pulses at variable repetition rates" Opt. Exp. 5280, vol. 14, No. 23, Jun. 2006.
Girkin et al., "Macroscopic multiphoton biomedical imaging using semiconductor saturable Bragg reflector modelocked Lasers"; Part of the SPIE Conference on Commercial and Biomedical Applications of Ultrafast Lasers, San Jose, CA (Jan. 1999), SPIE vol. 3616, 0277-786X/99, pp. 92-98.
Glezer et al., "Ultrafast-laser driven micro-explosions in transparent materials"; Applied Physics Letters, vol. 71 (1997), pp. 882-884.
Golub, I., "Fresnel axicon"; Optic Letters, vol. 31, No. 12, Jun. 15, 2006, Optical Society of America, pp. 1890-1892.
Gori et al. "Analytical derivation of the optimum triplicate" Optics Communications 157 (1998) pp. 13-16.
Herman et al., "Laser micromachining of 'transparent' fused silica with 1-ps. pulses and pulse trains"; Part of the SPIE Conference on Commercial and Biomedical Applications of Ultrafast Lasers, San Jose, CA (Jan. 1999), SPIE vol. 3616, 0277-786X199, pp. 148-155.
Honda et al. "A Novel Polymer Film that Controls Light Transmission", Progress in Pacific Polymer Science 3, 159-169 (1994).
Hu et al. "5-axis laser cutting interference detection and correction based on STL model" (2009) Zhongguo Jiguang/Chinese Journal of Lasers, 36 (12), pp. 3313-3317.
Huang et al., "Laser etching of glass substrates by 1064 nm laser irradiation", Applied Physics, Oct. 2008, vol. 93, Issue 1, pp. 159-162.
Jaramillo et al., Wet etching of hydrogenated amorphous carbon films, Mar. 7, 2001, Diamond and Related Materials, vol. 10, Issues 3-7, pp. 976-979 (Year 2001).
Juodkazis S. et al. Laser induced microexplosion confined in the bulk of a sapphire crystal: evidence of multimegabar pressures., Phys. Rev. Lett. 96, 166101, 2006.
Karlsson et al. "The technology of chemical glass strengthening—a review" Glass Technol: Eur. J. Glass Sci. Technol. A (2010) 51 (2) pp. 41-54.
Kosareva et al., "Formation of extended plasma channels in a condensed medium upon axicon focusing of a femtosecond laser pulse"; Quantum Electronics 35 (11) 1013-1014 (2005), Kvantovaya Elektronika and Turpion Ltd.; doi: 10.1070/QE2005v035n11ABEH013031.
Kruger et al., "Femtosecond-pulse visible laser processing of transparent materials"; Applied Surface Science 96-98 (1996) 430-438.
Kruger et al., "Laser micromachining of barium aluminium borosilicate glass with pluse durations between 20 fs and 3 ps"; Applied Surface Science 127-129 (1998) 892-898.
Kruger et al., "Structuring of dielectric and metallic materials with ultrashort laser pulses between 20 fs and 3 ps"; SPIE vol. 2991, 0277-786X197, pp. 40-47.
Lapczyna et al., "Ultra high repetition rate (133 MHz) laser ablation of aluminum with 1.2-ps. pulses"; Applied Physics A 69 [Suppl.], 5883-5886, Springer-Verlag (1999); doi: 10.1007/s003399900300.
Levy et al. "Design, fabrication, and characterization of circular Dammann gratings based on grayscale lithography," Opt. Lett vol. 35, No. 6, p. 880-882 (2010).
Liu X et al. "laser ablation and micromachining with ultrashort laser pulses", IEEE J. Quantum Electronics, 22, 1706-1716, 1997.
Maeda et al. "Optical performance of angle-dependent light-control glass", Proc. SPIE 1536, Optical Materials Technology for Energy Efficiency and Solar Energy Conversion X, 138 (Dec. 1, 1991).
Mbise et al. "Angular selective window coatings: theory and experiments" J. Phys. D: Appl. Phys. 30 2103 (1997).
McGloin et al."Bessel beams: diffraction in a new light" Contemporary Physics, vol. 46 No. 1 (2005) pp. 15-28.

(56) References Cited

OTHER PUBLICATIONS

Merola et al. "Characterization of Bessel beams generated by polymeric microaxicons" Meas. Sci. Technol. 23 (2012) 10 pgs.
Microchemicals, "Silicon Wafers, Quartz Wafers, Glass Wafers," Product Specifications: Brochure. 2014, 28 pgs.
Mirkhalaf, M. et al., Overcoming the brittleness of glass through bio-inspiration and micro-achitecture, Nature Communications, 5:3166/ncomm4166(2014).
Perry et al., "Ultrashort-pulse laser machining of dielectric materials"; Journal of Applied Physics, vol. 85, No. 9, May 1, 1999, American Institute of Physics, pp. 6803-6810.
Perry et al., "Ultrashort-pulse laser machining"; UCRL-1D-132159, Sep. 1998, pp. 1-38.
Perry et al., "Ultrashort-pulse laser machining"; UCRL-JC-132159 Rev T, Jan. 22, 1999, pp. 1-24.
Polynkin et al., "Extended filamentation with temporally chirped femtosecond Bessel-Gauss beams in air"; Optics Express, vol. 17, No. 2, Jan. 19, 2009, OSA, pp. 575-584.
Romero et al. "Theory of optimal beam splitting by phase gratings. II. Square and hexagonal gratings" J. Opt. Soc. Am. A/vol. 24 No. 8 (2007) pp. 2296-2312.
Salleo A et al., Machining of transparent materials using IR and UV nanosecond laser pulses, Appl. Physics A 71, 601-608, 2000.
Serafetinides et al., "Polymer ablation by ultra-short pulsed lasers" Proceedings of SPIE vol. 3885 (2000) http://proceedings.spiedigitallibrary.org/.
Serafetinides et al., "Ultra-short pulsed laser ablation of polymers"; Applied Surface Science 180 (2001) 42-56.
Shah et al. "Micromachining with a high repetition rate femtosecond fiber laser", Journal of Laser Micro/Nanoengineering vol. 3 No. 3 (2008) pp. 157-162.
Shealy et al. "Geometric optics-based design of laser beam shapers",Opt. Eng. 42(11), 3123-3138 (2003). doi:10.1117/1.1617311.
Smedskjaer et al; "Impact of ZnO on the Structure and Properties of Sodium Aluminosilicate Glasses: Comparison With Alkaline Earth Oxides," Journal of Noncrystalline Solids 381, 58-64 (2013).
Stoian et al. "Spatial and temporal laser pulse design for material processing on ultrafast scales" Applied Physics A (2014) 114, p. 119-127.

Sundaram et al., "Inducing and probing non-thermal transitions in semiconductors using femtosecond laser pulses"; Nature Miracles, vol. 1, Dec. 2002, Nature Publishing Group (2002), pp. 217-224.
Taiwanese Patent Application No. 106121686, Office Action dated Jan. 19, 2021, 5 Pages (English Translation Only); Taiwanese Patent Office.
Toytman et al. "Optical breakdown in transparent media with adjustable axial length and location", Optics Express vol. 18 No. 24, 24688-24698 (2010).
Vanagas et al., "Glass cutting by femtosecond pulsed irradiation"; J. Micro/Nanolith. MEMS MOEMS. 3(2), 358-363 (Apr. 1, 2004); doi: 10.1117/1.1668274.
Varel et al., "Micromachining of quartz with ultrashort laser pulses"; Applied Physics A 65, 367-373, Springer-Verlag (1997).
Velpula et al.. "Ultrafast imaging of free carriers: controlled excitation with chirped ultrafast laser Bessel beams", Proc. Of SPIE vol. 8967 896711-1 (2014).
Wang et al, "Investigation on $CO_2$ laser irradiation inducing glass strip peeling for microchannel formation", Biomicrofluidics 6, 012820 (2012).
Wu et al. "Optimal orientation of the cutting head for enhancing smoothness movement in three-dimensional laser cutting" (2013) Zhongguo Jiguang/Chinese Journal of Lasers, 40 (1), art No. 0103005.
Xu et al. "Optimization of 3D laser cutting head orientation based on the minimum energy consumption" (2014) International Journal of Advanced Manufacturing Technology, 74 (9-12), pp. 1283-1291.
Yan et al. "Fiber structure to convert a Gaussian beam to higher-order optical orbital angular momentum modes" Optics Letters vol. 37 No. 16 (2012) pp. 3294-3296.
Zeng et al. "Characteristic analysis of a refractive axicon system for optical trepanning"; Optical Engineering 45(9), 094302 (Sep. 2006), pp. 094302-1-094302-10.
Zhang et al., "Design of diffractive-phase axicon illuminated by a Gaussian-profile beam"; Acta Physica Sinica (overseas edition), vol. 5, No. 5 (May 1996) Chin. Phys. Soc., 1004-423X/96/05050354-11, pp. 354-364.
Pie Scientific, Photoresist stripping and descum organic contamination removal for silicon wafer, Feb. 2016 (Year: 2016).
West et al., Optimisation of photoresist removal from silicon wafers using atmosphericpressure plasma jet effluent, Jul. 2015, 22nd International Symposium on Plasma Chemistry (Year: 2015).

\* cited by examiner

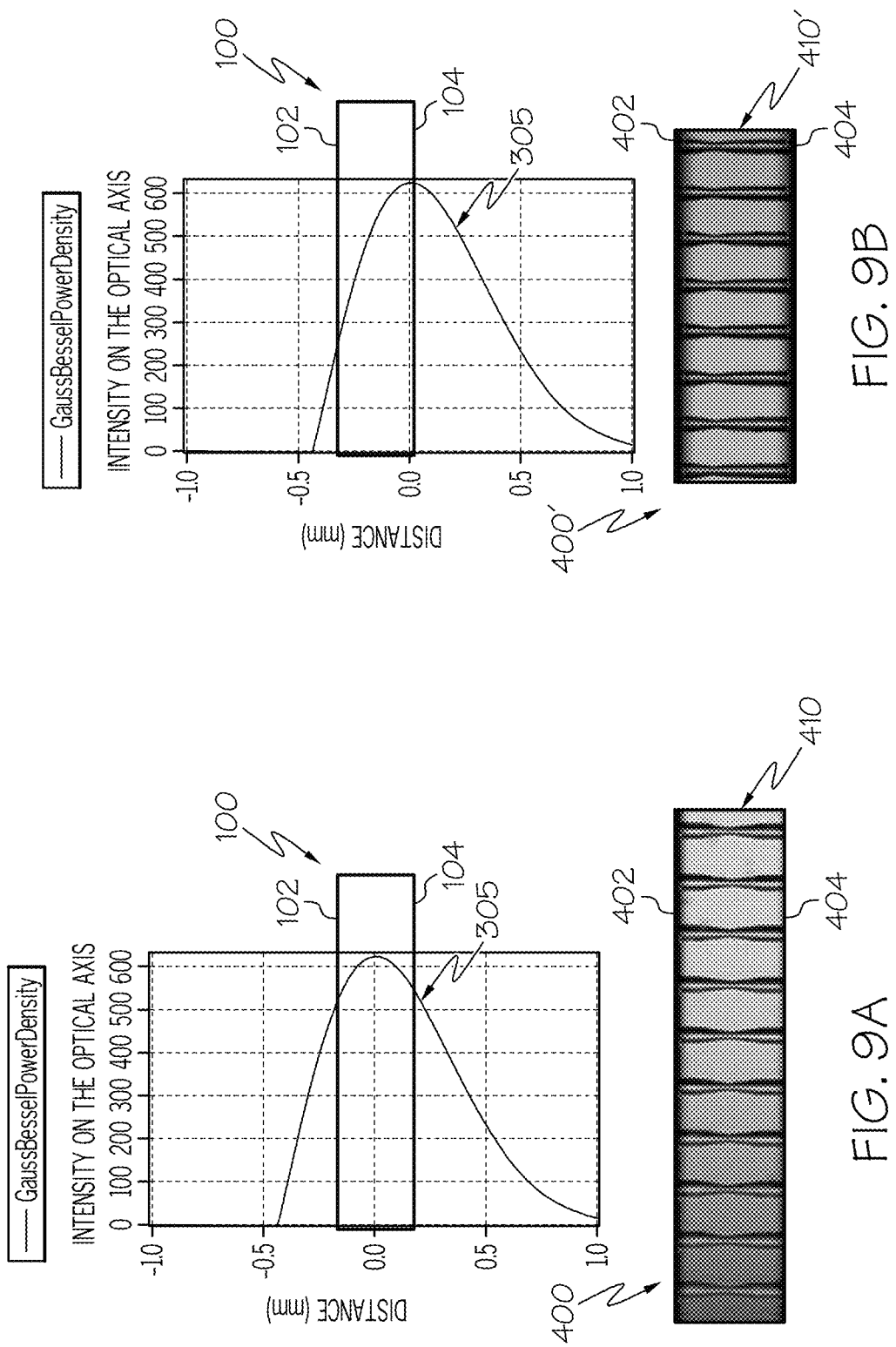

SILICA-CONTAINING SUBSTRATES WITH VIAS HAVING AN AXIALLY VARIABLE SIDEWALL TAPER AND METHODS FOR FORMING THE SAME This application claims the benefit of priority under 35 U.S.C. § 119 of U.S. Provisional Application Ser. No. 62/510,957, filed on May 25, 2017 and 62/588,615, filed on Nov. 20, 2017, the contents of both are relied upon and incorporated herein by reference in their entirety.

BACKGROUND

Field

The present disclosure generally relates to silica-containing substrates with vias. In particular, the present disclosure is directed to silica-containing substrates comprising at least 75 mol % silica with vias having an axially variable sidewall taper, electronic devices incorporating silica-containing substrates with vias, and methods for forming vias having an axially variable sidewall taper in silica-containing substrates.

Technical Background

Substrates, such as silicon, have been used as an interposer disposed between electrical components (e.g., printed circuit boards, integrated circuits, and the like). Metalized through-substrate vias provide a path through the interposer for electrical signals to pass between opposite sides of the interposer. Glass substrates are attractive materials that are highly advantageous for electrical signal transmission, as they have excellent thermal dimensional stability due to a low coefficient of thermal expansion (CTE), as well as very good low electrical loss at high frequencies electrical performance, and the possibility of being formed at thickness as well as at large panel sizes. In particular, high silica content substrates, such as fused silica, are even more attractive then generic glasses, as the CTE of fused silica can be extremely low (~0.5 ppm/deg C.), and the electrical loss tangent can be even lower than in glasses that often contain significant fractions of non-silica material. However, through-via formation and metallization in high silica content substrates presents significant challenges.

Vias may be filled by an electroplating process wherein electrically conductive material (e.g., copper) is deposited on the sidewalls of the via and continuously built up until the via is hermetically sealed. Electroplating vias require an hourglass shape having a narrow waist that provides a metal "bridge" for the electrically conductive material to be initially deposited. The electrically conductive material is continuously deposited on both sides of this bridge until the via is filled.

Small-diameter vias conducive to providing electrical connections in glass interposers of electronic devices may be formed by a laser-damage-and-etch process. In this process, a damage track is initially formed in the glass substrate by using a laser to modify the glass material along the damage track. An etching solution is then applied to the glass substrate. The glass substrate is thinned by the etching solution. Because the etching rate of the glass material is faster at the damage track, the damage track is preferentially etched so that a via is opened through the glass substrate. In most glass materials, the shape of the via is preferentially an hourglass-shape conducive to electroplating. However, in silica-containing substrates with high silica content, such as fused silica, the resulting via is cylindrically shaped without a narrow waist for providing a metal bridge during the electroplating process. Such straight-walled vias in fused silica cannot be electroplated.

Accordingly, a need exists for alternative methods of forming vias with an axially variable sidewall taper (e.g., hourglass shape) in silica-containing substrates, as well as silica-containing substrates incorporating such vias.

SUMMARY

In one embodiment, a method for processing a substrate including silica, a first surface, and a second surface opposite the first surface, includes forming, using a laser beam, a damage track through the substrate from the first surface to the second surface, wherein a level of modification of the substrate along the damage track decreases in a first direction starting from the first surface toward a bulk of the substrate, and the level of modification of the substrate decreases in a second direction starting from the second surface toward the bulk of the substrate. The damage track includes a first modified segment proximate the first surface, a second modified segment proximate the second surface, and a third modified segment disposed between the first highly modified segment and the second highly modified segment, wherein a level of modification of the third modified segment is less than a level of modification of the first modified segment and the second modified segment. The method further includes etching, using an etching solution, the substrate to form a via having a first diameter at the first surface, a second diameter at the second surface, and a via waist having a waist diameter between the first surface and the second surface, wherein the waist diameter is less than the first diameter and is less than the second diameter.

In another embodiment, an article includes a silica-containing substrate including greater than or equal to 85 mol % silica, a first surface, a second surface opposite the first surface, and a via extending through the silica-containing substrate from the first surface toward the second surface. The via includes a first diameter at the first surface having a diameter of less than or equal to 100 µm, a second diameter at the second surface having a diameter of less than or equal to 100 µm, and a via waist between the first surface and the second surface. The via waist has a waist diameter that is less than the first diameter and the second diameter such that a ratio between the waist diameter and each of the first diameter and the second diameter is less than or equal to 75%.

In yet another embodiment, an electronic device includes a silica-containing substrate including greater than or equal to 85 mol % silica, a first surface, a second surface opposite the first surface, and a via extending through the silica-containing substrate from the first surface toward the second surface. The via includes a first diameter at the first surface having a diameter of less than or equal to 100 µm, a second diameter at the second surface having a diameter of less than or equal to 100 µm, and a via waist between the first surface and the second surface, wherein the via waist has a waist diameter that is less than the first diameter and the second diameter such that a ratio between the waist diameter and each of the first diameter and the second diameter is less than or equal to 75%. The electronic device further includes a semiconductor device coupled to the silica-containing substrate, wherein the semiconductor device is electrically coupled to the via.

In yet another embodiment, a substrate includes greater than or equal to 85 mol % silica, a first surface, a second surface opposite the first surface, and a damage track through the substrate from the first surface to the second surface. A level of modification of the substrate along the damage track decreases in a first direction starting from the first surface toward a bulk of the substrate, and the level of modification of the substrate decreases in a second direction starting from the second surface toward the bulk of the substrate. The damage track includes a first modified segment proximate the first surface, a second modified segment proximate the second surface, and a third modified segment disposed between the first highly modified segment and the second highly modified segment.

In yet another embodiment, an article includes a silica-containing substrate including greater than or equal to 85 mol % silica, a first surface, a second surface opposite the first surface, and a via extending through the silica-containing substrate from the first surface toward the second surface. The via includes a first diameter at the first surface having a diameter of less than or equal to 100 µm, a second diameter at the second surface having a diameter of less than or equal to 100 µm, and a via waist between the first surface and the second surface. The via waist has a waist diameter that is less than the first diameter and the second diameter such that a ratio of the difference between the first diameter and the waist diameter to one-half a thickness of the silica-containing substrate is greater than or equal to 1/15.

Additional features and advantages of the embodiments described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The embodiments set forth in the drawings are illustrative and exemplary in nature and are not intended to limit the subject matter defined by the claims. The following detailed description of the illustrative embodiments can be understood when read in conjunction with the following drawings, where like structure is indicated with like reference numerals and in which:

FIGS. 9A-9C graphically depict an intensity profile of a Gauss-Bessel laser beam focal line of FIG. 6 with a maximum intensity positioned at various locations within a silica-containing substrate according to one or more embodiments described and illustrated herein;

DETAILED DESCRIPTION

Figure 1:
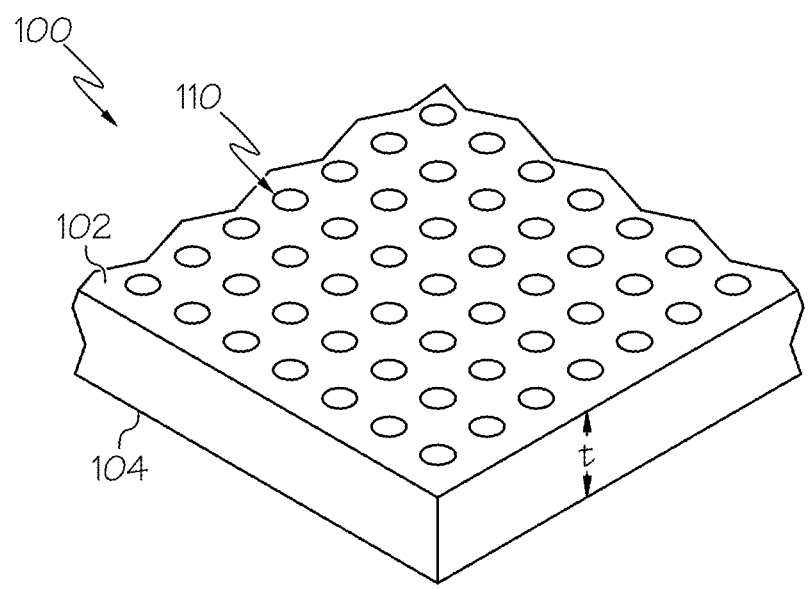
FIG. 1 schematically depicts a partial perspective view of a silica-containing substrate as an interposer according to one or more embodiments described and illustrated herein.

Referring generally to the figures, embodiments of the present disclosure are generally related to articles comprising silica-containing substrates having vias (e.g., holes) which allow for successful downstream processing including, but not limited to, via metallization/electroplating and application of redistribution layers (RDL). The article may be for use in semiconductor devices, radio-frequency (RF) devices (e.g., antennae, electronic switches, and the like), interposer devices, microelectronic devices, optoelectronic devices, microelectronic mechanical system (MEMS) devices and other applications where vias may be leveraged.

Embodiments of the present disclosure are also generally related to methods for creating vias in silica-containing substrates. In some embodiments, the vias have geometries that facilitate electroplating the vias. Silica-containing substrates include glass and glass-ceramics. As used herein, the term "silica-containing substrate" means silica-containing substrates comprises a silica ($SiO_2$) content greater than or equal to 75 mol %, greater than or equal to 80 mol %, greater than or equal to 85 mol %, greater than or equal to 90 mol %, greater than or equal to 91 mol %, greater than or equal to 92 mol %, greater than or equal to 93 mol %, greater than or equal to 94 mol %, greater than or equal to 95 mol %, greater than or equal to 96 mol %, greater than or equal to 97 mol %, greater than or equal to 98 mol %, greater than or equal to 99 mol %, or greater than or equal to 99.9 mol %. In some embodiments, the silica-containing substrate may be fused silica. Example silica-containing substrates include, but are not limited to, HPFS® fused silica sold by Corning Incorporated of Corning, N.Y. under glass codes 7980, 7979, and 8655. In one example, the silica-containing substrate is a substrate comprising unintentionally doped silica. The phrase "unintentionally doped" means that no additional ingredients are intentionally added to the silica prior to melting the silica.

Properties of silica make it a desirable substrate as an interposer in electronic devices. The term "interposer" generally refers to any structure that extends or completes an electrical connection through the structure, for example but not limited to, between two or more electronic devices disposed on opposite surfaces of the interposer. The two or more electronic devices may be co-located in a single structure or may be located adjacent to one another in different structures such that the interposer functions as a portion of an interconnect nodule or the like. As such, the interposer may contain one or more active areas in which vias and other interconnect conductors (such as, for example, power, ground, and signal conductors) are present and formed. The interposer may also include one or more active areas in which blind vias are present and formed. When the interposer is formed with other components, such as dies, underfill materials, encapsulants, and/or the like, the interposer may be referred to as an interposer assembly. Also, the term "interposer" may further include a plurality of interposers, such as an array of interposers or the like.

The low coefficient of thermal expansion (CTE) of silica minimizes expansion and movement of the silica-containing substrate due to the application of heat flux, such as heat flux generated by a semiconductor device that is coupled to the silica-containing substrate acting as an interposer. Expansion of the interposer due to CTE mismatch between the interposer and a semiconductor device (or other electronic component) may cause the bond between the interposer and the semiconductor to fail and result in separation or other damage.

Additionally, silica-containing substrates provide desirable RF properties over other substrates such as silicon. Desirable RF properties may be important in high frequency applications, such as high-speed data communications applications.

Thus, silica-containing substrates comprising greater than or equal to 75 mol %, 80 mol %, 85 mol %, 90 mol %, 95 mol %, or 99 mol % silica ($SiO_2$) may be a desired material in an interposer in particular electronics devices. However, use of silica-containing substrates presents challenges when particular geometries of the via are desired, including but not limited to, hourglass-shaped vias. Hourglass-shaped vias facilitate metalizing the vias by an electroplating process. During the electroplating process, electrically conductive material (e.g., copper, silver, aluminum, titanium, gold, platinum, nickel, tungsten, magnesium, or any other suitable material) is deposited within a via. An hourglass-shaped via has a narrow waist having a diameter that is less than a diameter of openings at the surfaces of the interposer. In the electroplating process, deposited metal forms a metal bridge at the waist location first, and then metal is deposited on the bridge to finish filling the via to enable a void-free hermetic filling of via.

Laser-damage-and-etch techniques may be utilized to form vias in silica-containing materials. However, conventional laser-damage-and-etch techniques used to form vias within silica-containing substrates as defined herein result in substantially cylindrical vias (i.e., vias with substantially straight walls). Therefore, electroplating of vias formed in silica-containing substrates may not be possible using conventional techniques because of the lack of a narrow waist and the ability for the formation of a metal bridge. The inability to produce vias having a narrow waist in silica-containing substrates may be due to the low etch rate of in hydrofluoric acid, and that the etching process results in no non-soluble by-products which clog or inhibit etching within the middle of the substrate and lead to a differential etch rate between the hole at the surface versus deep inside the silica-containing substrates. It is noted that the methods disclosed herein are not limited to silica-containing substrate comprising greater than or equal to 75 mol % silica ($SiO_2$). The methods disclosed herein may also be used on glass or glass-ceramic substrates having less than 75 mol % silica. For example, the methods described herein may also be utilized to form narrow-waist vias in glass or glass-ceramic substrates having less than 75 mol % silica ($SiO_2$), such as Eagle XG® glass and Gorilla® Glass sold by Corning Incorporated.

Embodiments described herein are directed to methods and articles comprising silica-containing substrates having vias formed by a laser-damage-and-etch process that include a particular interior wall geometry, such as an interior wall having a plurality of regions that each have a distinctive angle thereby defining an "hourglass" shape. Embodiments provide for high quality hourglass-shaped vias in silica-containing substrates that are formed practically and reliably. Various embodiments of articles, semiconductor packages, and methods of forming a via with a narrow waist in a substrate are described in detail below.

Referring now to FIG. 1, an example article comprising a silica-containing substrate 100 is schematically depicted in a partial perspective view. The silica-containing substrate 100 comprises a first surface 102 and a second surface 104 opposite from the first surface 102. A plurality of vias 110 extends through the bulk of the silica-containing substrate 100 from the first surface 102 to the second surface 104. It should be understood that any number of vias 110 may extend through the silica-containing substrate 100 in any arrangement. The thickness t of the silica-containing substrate 100 may be any appropriate thickness depending on the application. As non-limiting examples, the thicknesses t of the silica-containing substrate is within the range of 50 µm and 1 mm including endpoints, within a range of 100 µm and 700 µm including endpoints, within a range of 100 µm and 500 µm including endpoints, or within a range of 250 µm to 500 µm including endpoints.

A pitch of the vias 110, which is the center-to-center spacing between adjacent vias 110, may be any dimension according to the desired application, such as, without limitation, about 10 µm to about 2,000 µm, including about 10 µm, about 50 µm, about 100 µm, about 250 µm, about 1,000 µm, about 2,000 µm, or any value or range between any two of these values (including endpoints). In some embodiments, the pitch may vary between vias 110 on the same silica-containing substrate 100 (i.e., the pitch between a first via and a second via may be different from a pitch between the first via and a third via). In some embodiments, the pitch may be a range, such as about 10 µm to about 100 µm, about 25 µm to about 500 µm, about 10 µm to about 1,000 µm, or about 250 µm to about 2,000 µm.

Figure 2:
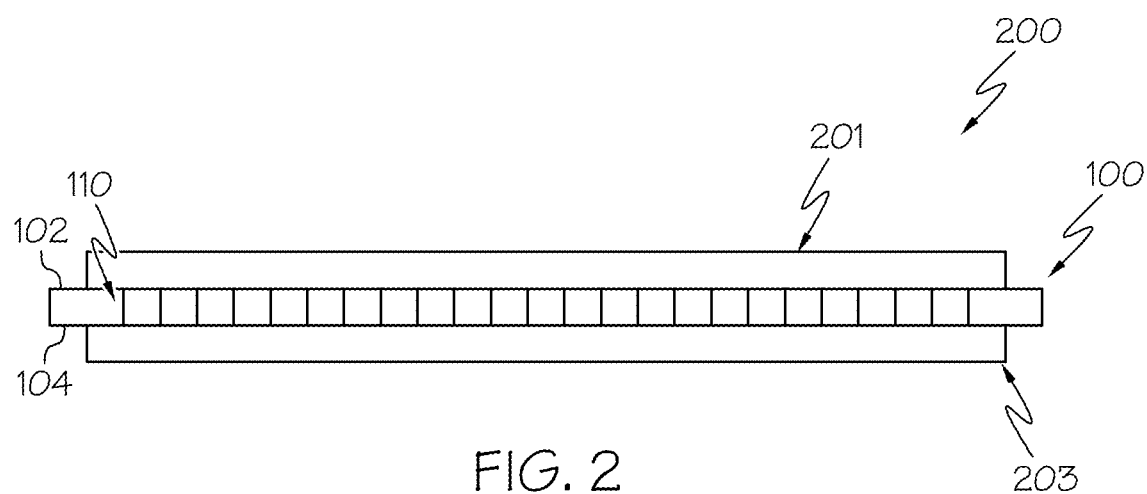
FIG. 2 schematically depicts an example electronic device comprising a silica-containing substrate as an interposer disposed between electronic devices according to one or more embodiments described and illustrated herein.

The silica-containing substrate 100 may be an interposer of an electronic device 200 as schematically illustrated in FIG. 2. The non-limiting electronic device 200 schematically illustrated in FIG. 2 comprises a first electrical component 201 coupled to the first surface 102 of the silica-containing substrate 100 and a second electrical component 203 coupled to a second surface 104 of the silica-containing substrate 100. The first electrical component 201 and the second electronic device 203 may be configured as any type of electrical component, such as, without limitation, a semiconductor device, a substrate, a power source, or an antenna. The silica-containing substrate 100 includes a plurality of metalized vias 110 that electrically couple the first electrical component 201 to the second electrical component 203 such that electrical signals and/or electrical power may pass therebetween.

Figure 3:
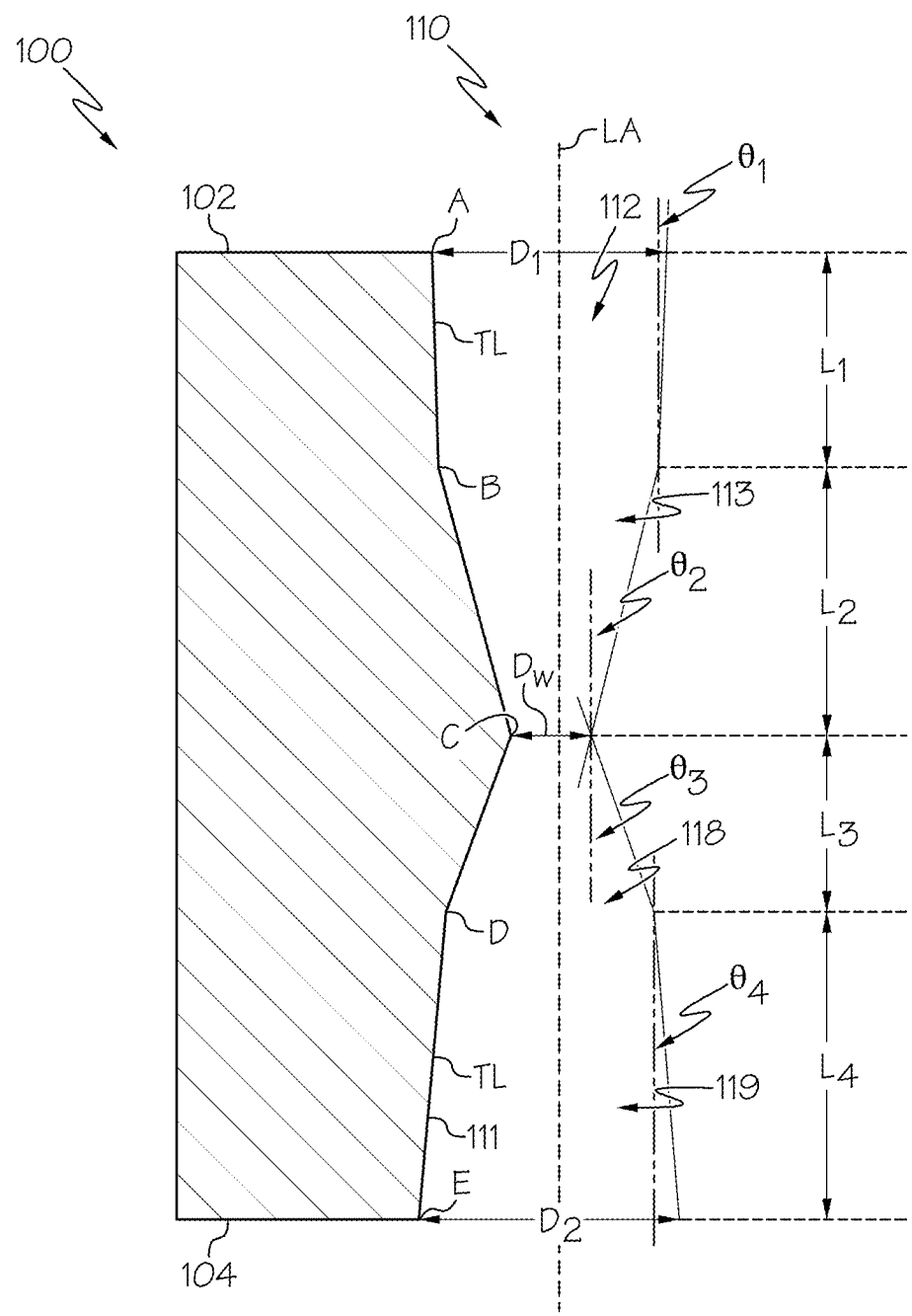
FIG. 3 schematically depicts dimensional characteristics of an example via through a silica-containing substrate according to one or more embodiments described and illustrated herein.

An example electrically conductive via 110 through a silica-containing substrate 100 having an hourglass-shaped profile is schematically depicted in FIG. 3. The via 110 has a first diameter $D_1$ at the first surface 102, and a second diameter $D_2$ at the second surface 104. The example via 110 further includes a longitudinal axis LA along a length of the via 110, an interior wall 111, and a waist w having a waist diameter $D_w$ that is the smallest diameter of the via 110. Thus, the waist diameter $D_w$ is smaller than both the first diameter $D_1$ and the second diameter $D_2$. As non-limiting examples, the profile of the via 110 is such that the waist diameter $d_w$ is less than 75%, less than 65%, less than 60%, less than 55%, less than 50%, less than 50%, less than 45%, less than 40%, less than 35%, less than 30%, less than 25%, less than 20%, less than 15%, less than 10%, or less than 5% of each of the first diameter $D_1$ and the second diameter $D_2$. Furthermore, if the etching time is reduced, then the holes from the two surfaces will fail to connect, leading to "blind" vias, which are vias that terminate in the bulk of the substrate. As non-limiting examples, post etching, the first diameter $D_1$ and the second diameter $D_2$ are within the range of 5 µm to 150 µm including end points, 5 µm to 100 µm including end points, 20 µm to 150 µm including endpoints, 30 µm to 60 µm including endpoints, or 40 µm to 50 µm including endpoints. In some embodiments, the first diameter $D_1$ and the second diameter $D_2$ are less than or equal to 100 µm, 90 µm, 80 µm, 70 µm, 60 µm, 50 µm, 40 µm, 30 µm, 20 µm, or 10 µm. The first diameter $D_1$ may or may not be equal to the second diameter $D_2$.

The example via 110 of FIG. 3 has four distinct tapered regions: a first tapered region 112, a second tapered region 113, a third tapered region 118 and a fourth tapered region 119. The example via 110 has four different taper angles: a first angle $\theta_1$, a second angle $\theta_2$, a third angle $\theta_3$, and a fourth angle $\theta_4$ corresponding to the first tapered region 112, the second tapered region 113, the third tapered region 118, and the fourth tapered region 119, respectively. The example via 110 is further characterized by four segments lengths: a first segment length $L_1$ extending from the first surface 102 to the transition to the second tapered region 113, a second segment length $L_2$ extending from the transition between the first tapered region 112 and the second tapered region 113 to the waist w, a third segment length $L_3$ extending from the waist w to the transition between the third tapered region 118 and the fourth tapered region 112, and a fourth segment length $L_4$ extending from the transition between the third tapered region 118 and the fourth tapered region 119 and the second surface 104.

The first through fourth segment lengths $L_1$-$L_4$ may be any appropriate lengths and are not limited by this disclosure. In the example of FIG. 3, each of the four segment lengths is different from one another. However, embodiments are not limited thereto. For example, the first segment length $L_1$ may be equal to the fourth segment length $L_4$ and/or the second segment length $L_2$ may be equal to the third segment length $L_3$.

It is noted that the taper angles shown in FIG. 3 are measured between respective reference lines parallel to the longitudinal axis LA and the interior wall 111 of the via 110. The first angle $\theta_1$ is measured from the interior wall 111 of the first tapered region 112 to the longitudinal axis LA. The second angle $\theta_2$ is measured from the interior wall 111 of the second tapered region 113 to the longitudinal axis LA. The third angle $\theta_3$ is measured from the interior wall 111 of the third tapered region 118 to the longitudinal axis LA. The fourth tapered angle $\theta_4$ is measured from the interior wall 111 of the fourth tapered region 112 to the longitudinal axis LA.

The angles of the via 110 with respect to the longitudinal axis LA may be determined by forming a traced line TL that matches the contour of the interior wall 111 of the particular tapered region. The traced line may then be analyzed to determine the slope of one or more portions of the interior wall 111 (including the various tapered regions 112, 113, 118, 119). For example, as depicted in FIG. 3, the traced line TL is graphically depicted and the computer software described herein is used to determine one or more linear regions of the traced line TL. A linear region is defined as follows: (1) the length of the region is no less than 5 µm, and may generally be greater than 10 µm; (2) the region can be fit to a linear function (y=a+bx) wherein y is the radius of the hole and x is the depth of the substrate, with the absolute value of the fit residual less than 1 µm; and (3) the slope of the fit function for any adjacent region should be different by at least 0.01, which translates to a 0.57 degree difference in terms of tapered angle. A region meeting all of the criteria described above is referred to as a region having a constant slope (i.e., a linear region). As shown in FIG. 3, the traced line TL has four distinct linear regions: the region between points A and B, the region between points B and C, the region between points C and D, and the region between points D and E. As such, the slope of the regions between points A and B, between points B and C, between points C and D, and between points D and E is constant. However, there may be areas of the traced line TL surrounding each points A, B, C, D, and E that have non-constant slope. These areas may be transition areas between the areas of constant slope, as described in greater detail herein. Such areas may occur where there is a gradual transition between tapered regions.

Figure 12:
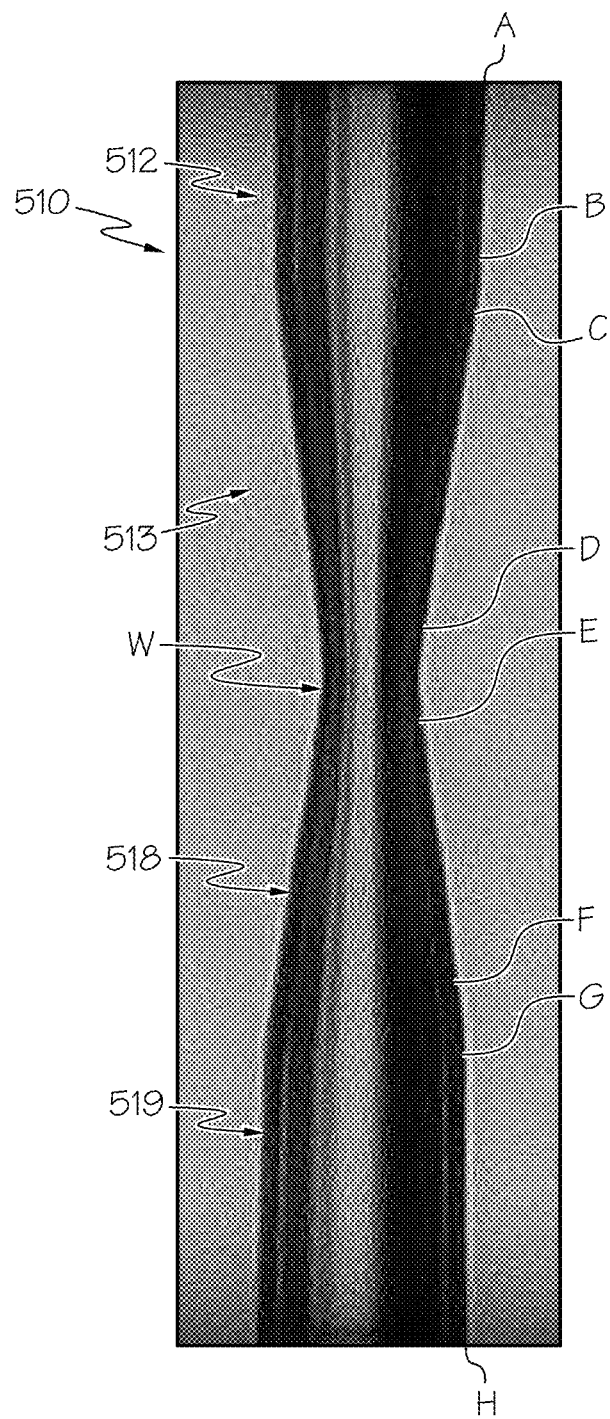
FIG. 12 depicts a digital image of a via having an hourglass shape within a silica-containing substrate formed by a laser-damage-and-etch process according to one or more embodiments described and illustrated herein.

The transition area between the slope of each of the tapered regions may occur in any instance where a region of constant slope of the interior wall 111 ends. Referring briefly to FIG. 12, a via 510 formed within a silica-containing substrate that comprises a first tapered region 512 between points A and B, a second tapered region 513 between points C and D, a third tapered region 518 between points E and F, and a fourth tapered region 519 between points G and H is graphically depicted. The example via 510 has transition areas with non-constant slope that are the regions of the traced line 1415 between points B and C, between points D and E, and between points F and G. In some embodiments, the slope of the transition area varies from the slope of the region of constant slope by greater than or equal to about 0.57 degrees, greater than or equal to about 1 degree, greater than or equal to about 2 degrees, greater than or equal to about 3 degrees, greater than or equal to about 4 degrees, or greater than or equal to about 5 degrees.

As noted above, the constant slope of each tapered region may be defined by an angle relative to the longitudinal axis LA of the via, which is generally perpendicular to the first surface 102 and/or the second surface 104. Referring once again to FIG. 3, each of the first angle $\theta_1$ and the fourth angle $\theta_4$ is smaller than each of the second angle $\theta_2$ and the third angle $\theta_3$ due to the strongly modified material proximate the first surface 102 and the second surface 104 of the silica-containing substrate 100, and the more weakly modified material in the bulk region of the silica-containing substrate 100. As an example and not a limitation, each of the first angle $\theta_1$ and the fourth angle $\theta_4$ is less than 5 degrees, for example in a range from greater than 0 degrees and 5 degrees, greater than 0 degrees and 4 degrees, greater than 0 degrees and 3 degrees, greater than 0 degrees and 2 degrees, 1 degree and 5 degrees, 1 degree and 4 degrees, 1 degree and 3 degrees, 1 degree and 2 degrees, 2 degrees and 5 degrees, 2 degrees and 4 degrees, 2 degrees and 3 degrees, or 4 degrees, 3 degrees, 2 degrees, or 1 degree. In the example of FIG. 3, each of the tapered angles is different from one another. However, embodiments are not limited thereto. For example, the first angle $\theta_1$ and the fourth angle $\theta_4$ may be equal to one another, and/or the second angle $\theta_2$ and the third angle $\theta_4$ may be equal to one another.

As noted above, waist w is the region of the via having the smallest diameter ($D_w$). The vias 110 through substrates described herein may be characterized by a ratio of the difference between the first diameter (or the second diameter) and the waist diameter to one-half a thickness of the silica-containing substrate is greater than or equal to 1/15, as provided in the following relationship:

$$\frac{d_1 - d_w}{\frac{1}{2}t} \geq \frac{1}{15}.$$

The via 110 may be filled with an electrically conductive material by any known or yet-to-be-developed process, such as sputter, electroplating or paste filling. The electrically conductive material may be any suitable material, such as, without limitation, copper, silver, aluminum, titanium, gold, platinum, nickel, tungsten, or magnesium.

Figure 4C:
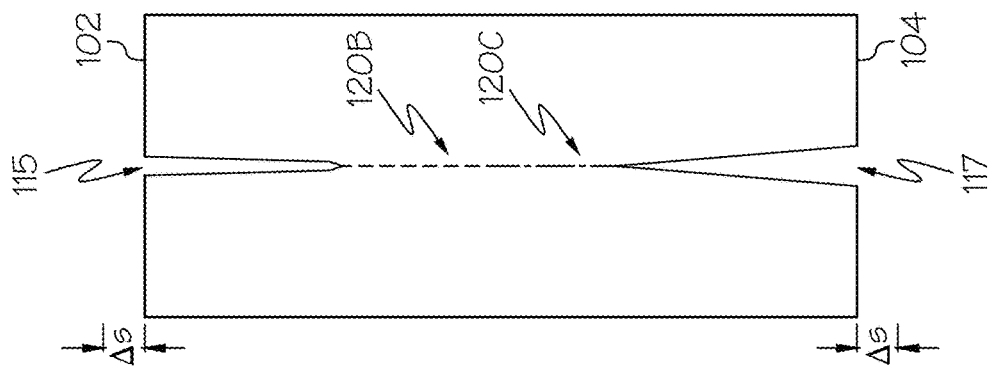
FIGS. 4A-4E schematically depict an evolution of the formation of an example via through a silica-containing substrate according to one or more embodiments described and illustrated herein.
Figure 4B:
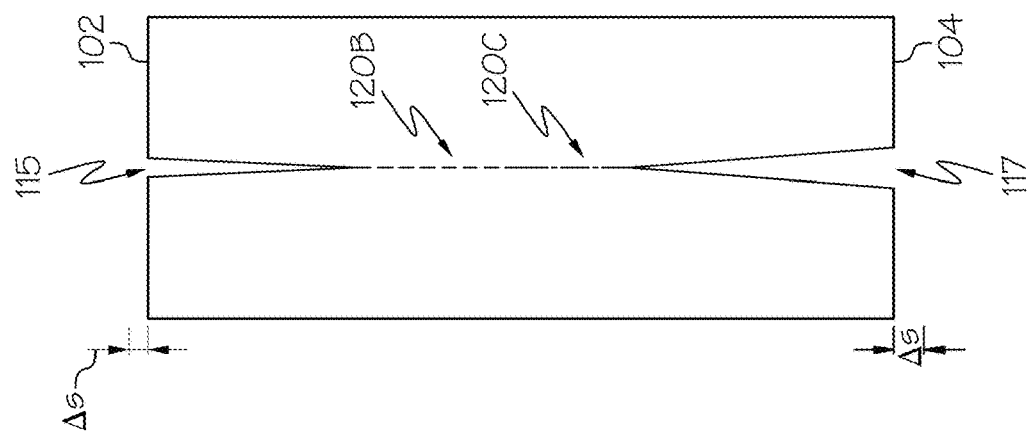
Figure 4A:
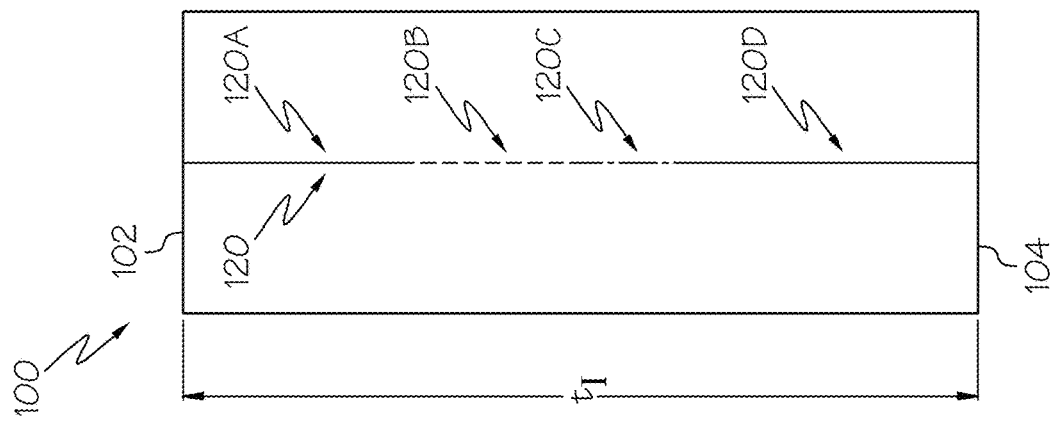
Figure 11A:
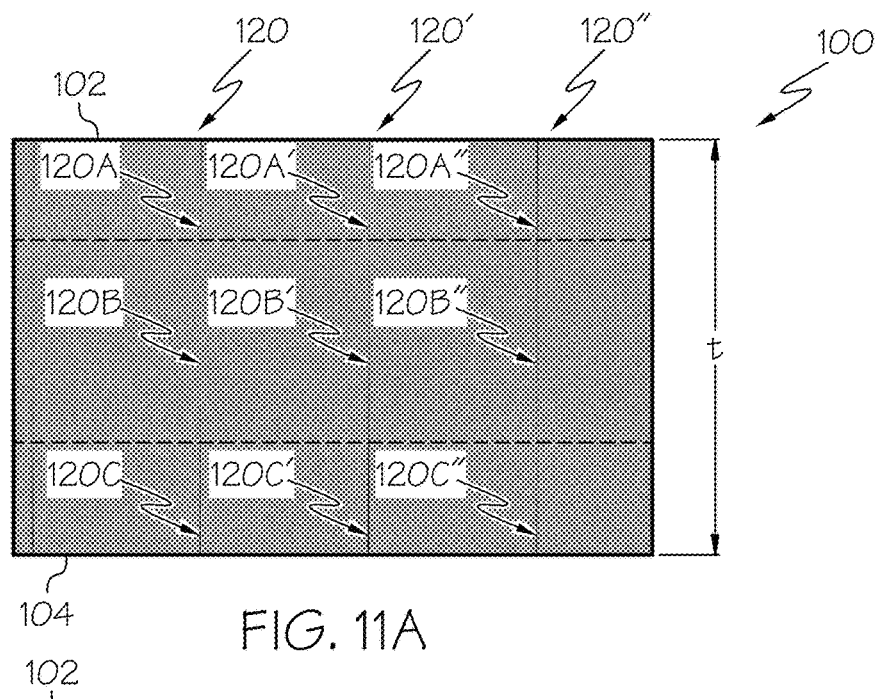
FIGS. 11A-11C depict digital images of damage tracks within a silica-containing substrate according to one or more embodiments described and illustrated herein.

Referring now to FIGS. 4A-4E, a laser-damage-and-etch process and an evolution of the fabrication of a via 110 with an axially variable sidewall taper in a silica-containing substrate 100 having an initial thickness $t_f$ are schematically illustrated. Referring to FIG. 4A, a damage track 120 is formed using a laser beam through a bulk of the silica-containing substrate 100 from the first surface 102 to the second surface 104. As an example and not a limitation the damage track 120 has a diameter that is less than or equal to 1 µm. The laser beam modifies the material along the damage track 120. As used herein, the terms "modify" or "modification" with respect to the silica-containing substrate means a change in refractive index, a change in material density, melting, compacting, ablation, or chemical alteration of the material. The modification may also include cracking of the material to create microscopic fissures or voids that can facilitate the penetration of gaseous or liquid etchant. The laser beam forms the damage track 120 such that the damage track 120 has segments providing different etching properties. A level of modification of the silica-containing substrate 100 is strongest proximate the first surface 102 and the second surface 104, and the level of modification decreases in a direction into the bulk of the silica-containing substrate 100 along the damage track 120. The level of modification affects the etching rate of the silica-containing substrate 100. The higher the level of modification, the faster the etch rate of the silica-containing substrate 100. In embodiments described herein, a level of modification is determined by evaluating the damage track 120 under a microscope in the presence of backlighting. In the presence of backlighting, the darker the material along the damage track 120 the higher the level of modification. In embodiments, the damage track 120 appears darker near the surfaces of the silica-containing substrate 100 (i.e., the damage track has a high level of modification in these segments), and appears lighter near the middle of the silica-containing substrate 100 (i.e., the damage track has a low level of modification in these segments as compared to the segments proximate the surfaces). FIG. 11A, which is described in more detail below, illustrates the appearance of varying levels of material modification of damage tracks 120, 120', 120" in a backlit silica-containing substrate 100 under a microscope.

In the example of FIG. 4A, the damage track 120 includes four segments each having a different level of modification and therefore different etching properties: a first modified segment 120A, a second modified segment 120B, a third modified segment 120C, and a fourth modified segment 120D. It should be understood that the level of modification between the various segments may not be discrete. Rather, the level of modification may gradually vary along damage track 120. Thus, the level of modification may vary within the individual segments of the damage track 120.

As noted above, the damage track 120 is configured such that the highest level of modification occurs proximate the first surface 102 and the second surface 104 of the silica-containing substrate 100. Therefore, the first modified segment 120A and the fourth modified segment 120D are highly modified segments. The second modified segment 120B and the third modified segment 120C are minimally modified segments in that they have a level of modification that is less than that of the first segment 120A and the fourth segment 120D. Although the second segment 120B and the third segment 120C are illustrated as individual segments, in some embodiments, the second segment 120B and the third segment 120C are a single, minimally modified segment having a level of modification that is less than the level of modification of first modified segment 120A and fourth modified segment 120D.

Details regarding laser beam properties utilized to form the damage track are discussed below with respect to FIGS. 5-8.

After forming the damage track 120, the silica-containing substrate 100 is etched by application of an etching solution. In an example, the silica-containing substrate 100 is disposed in a bath of etching solution. Alternatively, the etching solution may be sprayed onto the silica-containing substrate 100. The type of etching solution is not limited by this disclosure. Any known or yet-to-be-developed etching solution capable of etching silica-containing substrates may be utilized. In one example, the etching solution comprises hydrofluoric acid (HF) or sodium/potassium hydroxide. As a particular example, an etching solution for etching fused silica includes 20% HF by volume or 20% HF with 12% HCl by volume at about 47 degrees Celsius provides an etch rate of about 0.005 μm/second. Temperature adjustments (e.g., 10 degrees Celsius to 50 degrees Celsius) and acid concentration adjustments may be made to change the etch rate. Other mineral acids may be substituted for HCl, such as nitric acid ($HNO_3$). It is also possible to use hydroxide etchants, such as sodium hydroxide (NaOH) and potassium hydroxide (KOH).

The etching solution etches away material at each of the first surface 102 and the second surface 104 of the silica-containing substrate 100 by an amount Δs as shown in FIG. 4B. The material damaged within the strongly modified first segment 120A and fourth segment 120D of the damage track 120 are etched at a faster rate than the non-damaged regions outside of the damage track 120. This faster etch rate due to the damaged material causes a first pilot hole 115 to open at the first surface 102 and extend through a bulk of the silica-containing substrate 100 along the first segment 120A of the damage track, and a second pilot hole 117 to open at the second surface 104 and extend through the bulk of the silica-containing substrate 100 along the fourth segment 120D of the damage track 120. As shown in FIG. 4C, the first pilot hole 115 and the second pilot hole 117 extend deeper into the bulk of the silica-containing substrate 100, and the silica-containing substrate 100 is further thinned by an increased amount Δs.

Figure 4E:
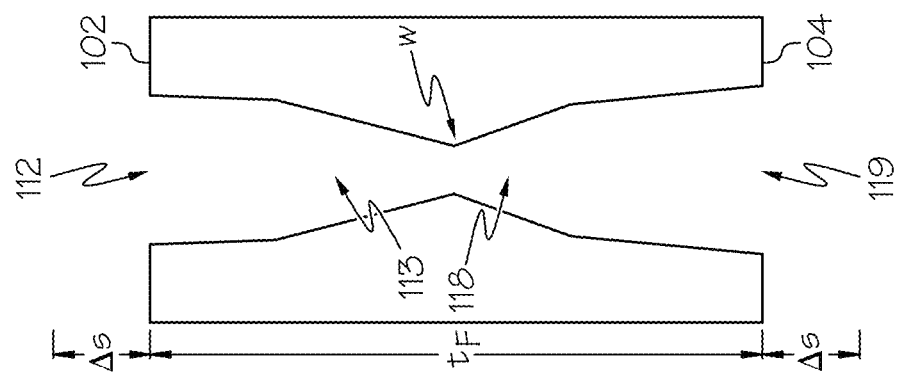
Figure 4D:
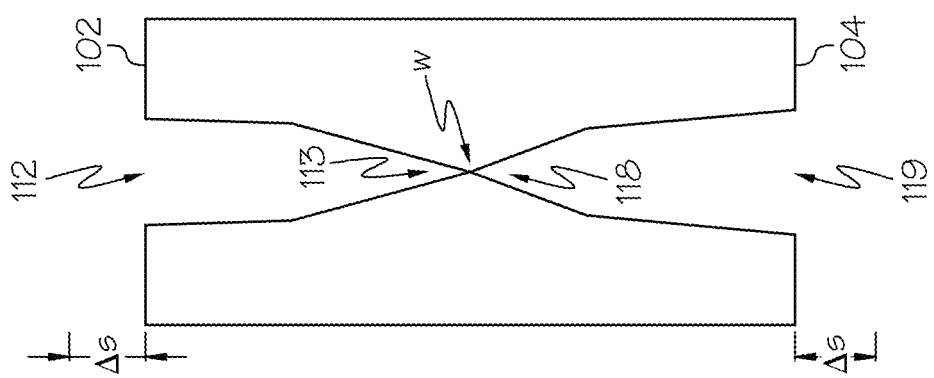

Referring now to FIG. 4D, the continued etching of the silica-containing substrate 100 causes a diameter of the first pilot hole 115 to increase and open into a first tapered region 112, and a diameter of the second pilot hole 117 to increase and open into a fourth tapered region 119. The first surface 102 and the second surface 104 of the silica-containing substrate 100 is further thinned by an increased amount Δs. By this time, the etching solution reaches the second segment 120B and the third segment 120C of the damage track 120. The second segment 120B opens into a second tapered region 113, and the third segment 120C opens into a third tapered region 118. Because the level of modification of the material is lower in the second segment 120B and the third segment 120C than the first segment 120A and the fourth segment 120D, the etch rate is slower in the second segment 120B and the third segment 120C than the first segment 120A and the fourth segment 120D. As shown in FIG. 4D, the differences in the level of modification along the damage track 120 causes the angle of the second tapered region 113 and the third tapered region 118 with respect to the longitudinal axis LA to be larger than the angle of the first tapered region 112 and the fourth tapered region 119.

The second tapered region 113 and the third tapered region 118 meet at a waist w. The waist w is the narrowest region of the via 110, and is the location where a metal bridge forms during the electroplating process. Referring now to FIG. 4E, a completed example via 110 within a fused substrate having a final thickness $t_F$ is shown. As shown, the via 110 has an axially variable sidewall taper that results in distinct segments, as well as a narrow waist w providing a location for a metal bridge to form during the electroplating process.

The damage tracks 120 described herein having varying levels of modification of the silica-containing substrate 100 may be formed by a variety of laser processes. In an example illustrated by FIG. 5, the damage track 120 is formed in the silica-containing substrate 100 by scanning a focused laser spot LS of a laser beam 150 through the thickness t of the silica-containing substrate 100 in a direction z, with the power of the laser beam being modulated during the scan as shown by graph 152 to create different levels of material modification (i.e., damage) at different depths from the surfaces of the silica-containing substrate 100. The laser power is lower when the focused laser spot LS is within a bulk of the silica-containing substrate 100 (i.e., near the middle) than when the focused laser spot LS is positioned close to the first surface 102 and the second surface 104 of the silica-containing substrate 100. However, this method would require many sequential laser exposures to form the damage track 120 through the full thickness of the silica-containing substrate 100, which may make the process slow.

Figure 6:
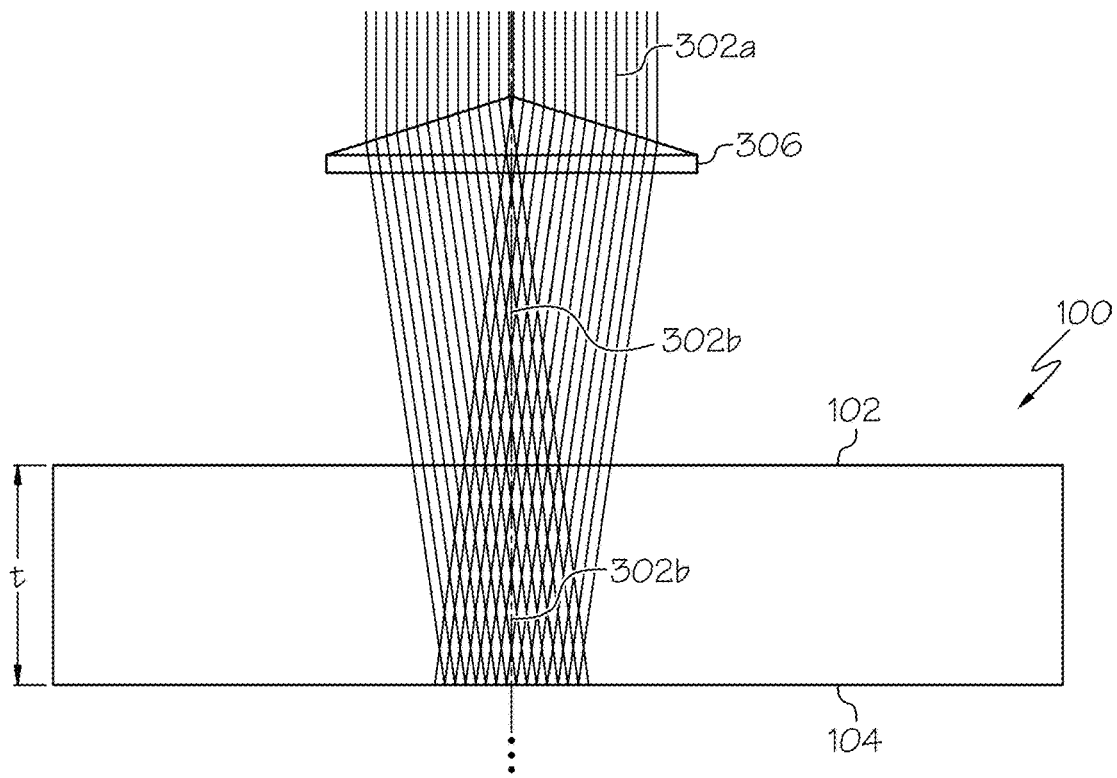
FIG. 6 schematically depicts a method of forming a damage track within a silica-containing substrate by using a pulsed laser beam focused into a laser beam focal line positioned within a bulk of the silica-containing substrate according to one or more embodiments described and illustrated herein.

Referring to FIG. 6, in another example, the damage track 120 is formed by a pulsed laser beam 302a that is focused into a laser beam focal line 302b that is positioned through the bulk of the silica-containing substrate 100. The laser beam focal line generates an induced multi-photon absorption within the silica-containing substrate 100. The multi-photon induced absorption produces a material modification within the silica-containing substrate along the laser beam focal line 302b, thereby forming the damage track 120. The laser beam focal line 302b is created by optics 306, which as a non-limiting example depicted in FIG. 6, is a conical lens (i.e., an axicon). Additional description of methods for generating and using a laser beam focal line for drilling glass substrates is provided in U.S. Pat. No. 9,517,963, which is incorporated by reference herein in its entirety.

The optics 306 form the laser beam into an extended focus, or quasi-non-diffracting beam resulting in a Bessel-like or Gauss-Bessel beam. Because of the quasi-non-diffracting nature of the beam, the light maintains a tight focused intensity over a much longer range than is achieved with more commonly used Gaussian beams, allowing the full thickness t of the glass substrate to be damaged by a single burst pulse or a closely timed burst train of laser pulses.

To modify the silica-containing substrate and create the damage track, the wavelength of the pulsed laser beam should be transparent to the silica-containing substrate material. The pulse duration and intensity should be short enough to achieve the multi-photon absorption effect described above. Ultra-short pulse lasers may be utilized, such as picosecond or femtosecond laser sources. In some embodiments, a ~10 picosecond pulsed laser may be utilized. As an example and not a limitation, with a line focus of between about 1 mm and about 3 mm extent, and a ~10 picosecond pulsed laser that produces output power of greater than about 50 W at a repetition rate of 200 kHz (250 μJ/pulse), then the optical intensities in the line region can be high enough to create non-linear absorption in the silica-containing substrate.

Figure 7:
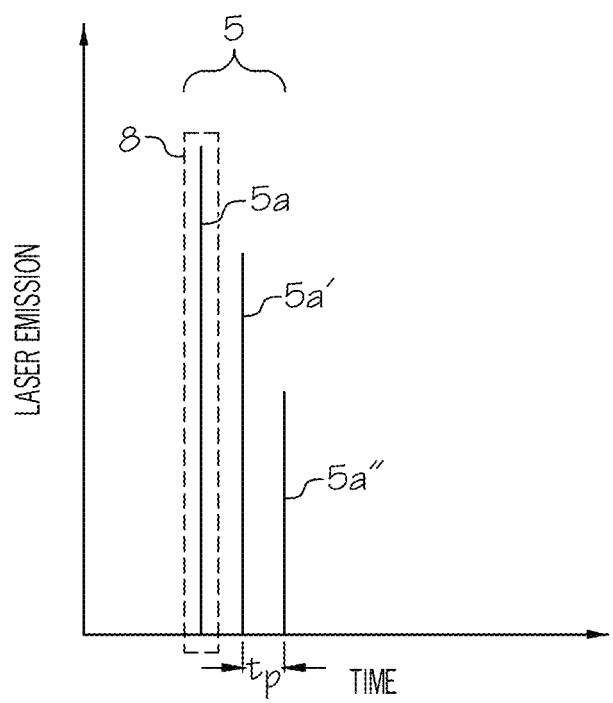
FIGS. 7 and 8 schematically depict sub-pulses of the pulsed laser beam depicted in FIG. 6 according to one or more embodiments described and illustrated herein.
Figure 8:
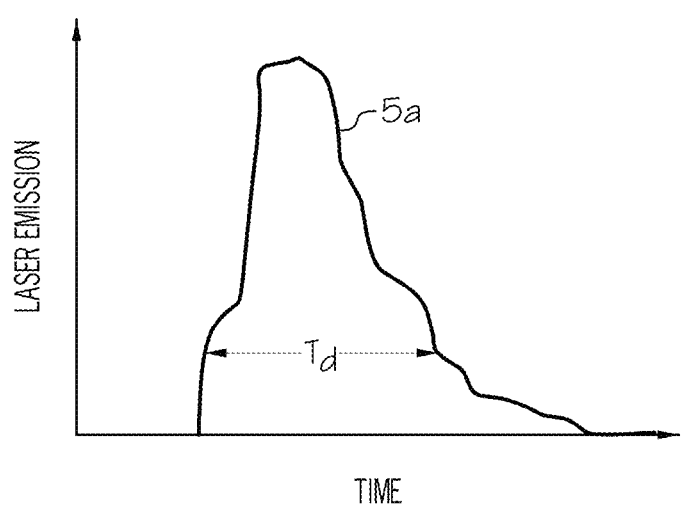

Note that the operation of such a picosecond laser described herein creates a "pulse burst" 5 sub-pulses 5a. FIG. 7 depicts three sub-pulses 5a, 5a', and 5a" (collectively "5a"). Producing pulse bursts is a type of laser operation where the emission of pulses is not in a uniform and steady stream but rather in tight clusters of sub-pulses. Each pulse burst contains multiple individual sub-pulses 5a (such as, without limitation, at least 2 sub-pulses, at least 3 sub-pulses, at least 4 sub-pulses, at least 5 sub-pulses) of very short duration. That is, a pulse bust 5 is a "pocket" of sub-pulses 5a, and the pulse bursts 5 are separated from one another by a longer duration than the separation of individual adjacent pulses within each burst. Referring to FIG. 8, which plots laser emission against time for sub-pulse 5a of FIG. 7, sub-pulses have may have a pulse duration $T_d$ of up to 100 psec (for example, 0.1 psec, 5 psec, 10 psec, 15 psec, 18 psec, 20 psec, 22 psec, 25 psec, 30 psec, 50 psec, 75 psec, or therebetween). These individual sub-pulses (e.g., sub-pulses 5a, 5a', and 5a") within a single pulse burst 5 are referred to as sub-pulses herein to denote the fact that they occur within a single pulse burst. The energy or intensity of each individual sub-pulse 5a. 5a', 5a" within the pulse burst 5 may not be equal to that of other sub-pulses within the pulse burst, and the intensity distribution of the multiple sub-pulses within a pulse burst often follows an exponential decay in time governed by the laser design.

Each sub-pulse (e.g., sub-pulses 5a, 5a', 5a") within the pulse burst 5 of the exemplary embodiments described herein are separated in time from the subsequent sub-pulse in the burst by a duration $t_p$ from 1 nsec to 50 nsec (e.g. 10-50 nsec, or 10-30 nsec, with the time often governed by the laser cavity design). For a given laser, the time separation $t_p$ between each sub-pulses (sub-pulse-to-sub-pulse separation) within a pulse burst 5 is relatively uniform (±10%). For example, in some embodiments, each sub-pulse within a pulse burst may be separated in time from the subsequent sub-pulse by approximately 20 nsec (50 MHz). For example, for a laser that produces a sub-pulse separation $t_p$ of about 20 nsec, the sub-pulse-to-sub-pulse separation $t_p$ within a pulse burst is maintained within about ±10%, or is about ±2 nsec.

It has been observed that too many sub-pulses results in a cylindrically shaped via. Particularly, a fifteen sub-pulse burst providing 80 µJ of energy produced a cylindrically shaped via, while a five sub-pulse burst providing 50 µJ produced an hourglass shaped via. The former has a lesser energy per sub-pulse, but will create a very uniform damage track through the thickness of the silica-containing substrate, whereas the latter has a greater energy per sub-pulse but will create a more non-uniform damage track through the thickness of the silica-containing substrate, with stronger damage being observed near the glass surfaces and weaker damage being observed near the middle of the silica-containing substrate.

The laser beam focal line 302b typically has a uniform intensity. However, in the embodiments described herein, the amount of energy and the number of laser beam bursts are controlled to provide for non-uniform levels of modification along the desired damage track 120. In other words, the damage pattern as a function of depth within the silica-containing substrate 100 is not uniform. What is observed is that the amount of material modification near the surfaces of the silica-containing substrate 100, in particular within 100 µm of each surface, is significantly different and stronger than the damage in the middle (center) of the silica-containing substrate 100. As observed under a microscope with back-lighting, the regions near the surfaces of the silica-containing substrate 100 typically appear very dark, indicating greater optical scattering and material modification, whereas the regions near the center of the silica-containing substrate 100 appear as light colored or broken up dark regions, indicating less light scattering and hence weaker or less spatially consistent material modification. In addition, the regions near the surfaces of the silica-containing substrate 100 will often exhibit actual holes, or regions where material has been ejected/ablated from the substrate, which can provide an easy path for chemical etchant to penetrate.

This effect of stronger damage near the surfaces is particularly evident as the laser energy of the laser beam focal line 302b is reduced to just above the threshold need to modify the silica-containing substrate 100, such as within 60% above the threshold, within 65% above the threshold, within 55% above the threshold, within 50% above the threshold, within 45% above the threshold, within 40% above the threshold, within 35% above the threshold, within 30% above the threshold, within 25% above the threshold, within 20% above the threshold, within 15% above the threshold, or within 10% above the threshold. As used herein, the term "threshold" means a minimum energy needed to create surface damage on the substrate using a laser beam focal line. In such a situation, the regions closest to the surfaces will still exhibit dark damage regions, but the middle of the silica-containing substrate will in some cases show no obvious damaged or modified regions at all. As described above, this differential damage effect as a function of depth observed with non-diffracting beams may be taken advantage of to form tapered vias in silica-containing substrate where such vias shapes are not otherwise possible. As non-limiting examples, an operating range of the pulsed laser beam is within a range of 40 µJ to 55 µJ including endpoints, or within 45 µJ to 50 µJ including endpoints for five sub-pulses.

It is possible to shift the location of the waist w of the via by altering the position of the maximum intensity of the laser beam focal line. FIG. 9A plots the intensity 305 of the laser beam focal line through the silica-containing substrate 100, and illustrates resulting vias 410 in an example silica-containing substrate 400. As shown in FIG. 9A, positioning the maximum intensity 305 at the center of the silica-containing substrate 100 results in vias 410 have a waist in the center of the silica-containing substrate 400 after the etching process.

Figure 9C:
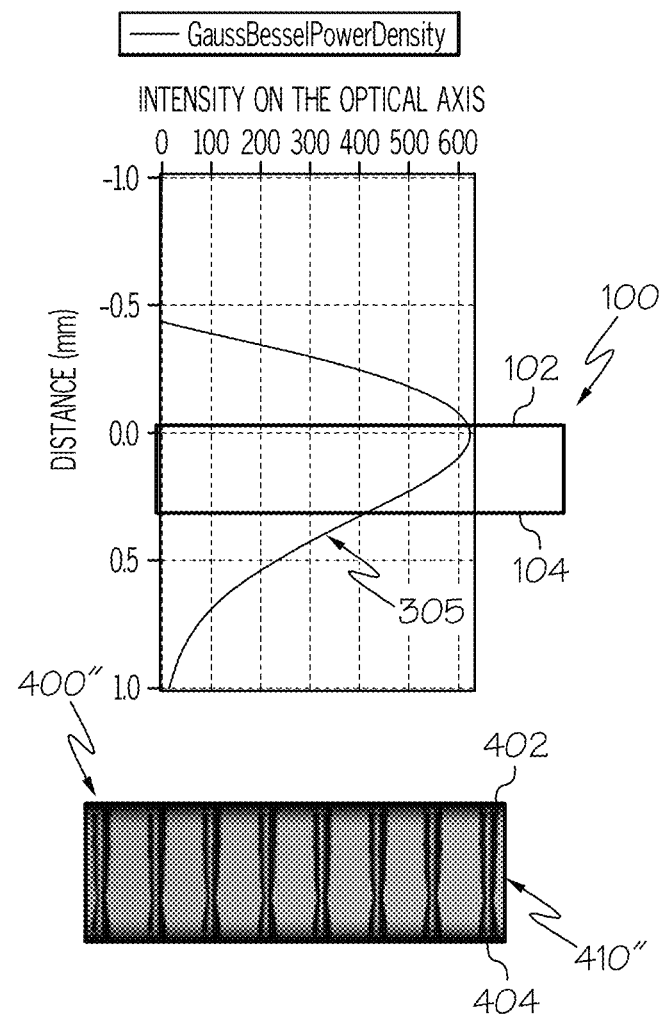

FIG. 9B graphically illustrates a shift of the maximum intensity 305 of the laser beam focal line to the first surface 102 of the silica-containing substrate 100. FIG. 9B further illustrates an example silica-containing substrate 400' with vias 410' following an etching process having a waist that is closer to the second surface 404 than the first surface 402. FIG. 9C graphically illustrates a shift of the maximum intensity 305 of the laser beam focal line to the second surface 104 of the silica-containing substrate 100. FIG. 9C further illustrates an example silica-containing substrate 400" with vias 410" following an etching process having a waist that is closer to the first surface 402 than the second surface 404. Shifting the waist w leads to an asymmetrical via about a plane through a center of the silica-containing substrate 100.

It is noted that it is not required to make the optical intensity of the quasi-non-diffracting beam (e.g., the laser beam focal line 302b) stronger near the surfaces of the silica-containing substrate 100. However, it is possible to design optics, such as waxicon-like elements, which create custom optical energy distributions along the beam propagation direction. In such a case, the optical intensity of the laser beam focal line 302b may be enhanced near the fused substrate surfaces, while creating a lower intensity region in the middle of the silica-containing substrate. Example optics for customizing the energy distribution of a laser beam focal line are described in U.S. Pat. Appl. No. 62/381,345.

Figure 10A:
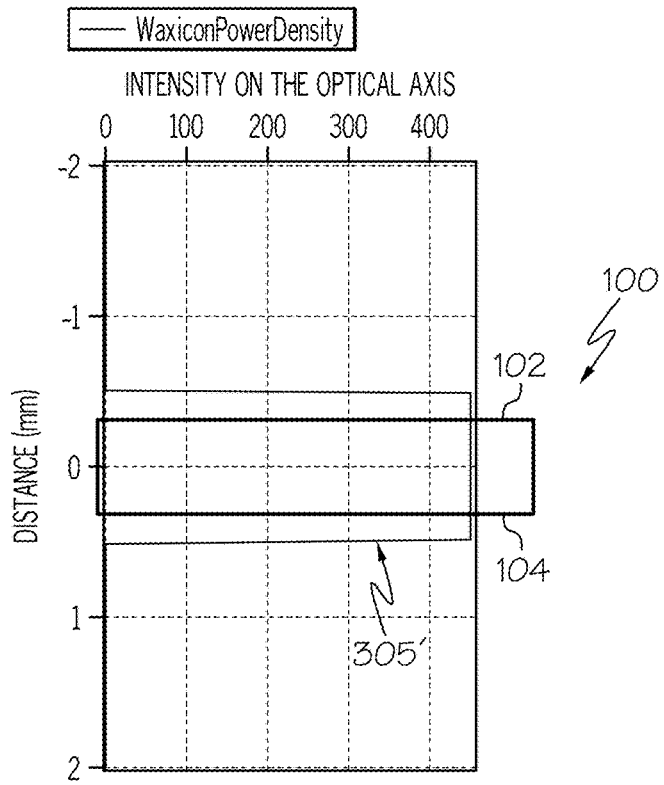
FIGS. 10A and 10B graphically depict two different intensity profiles on the laser beam focal line depicted in FIG. 6 according to one or more embodiments described and illustrated herein.
Figure 10B:
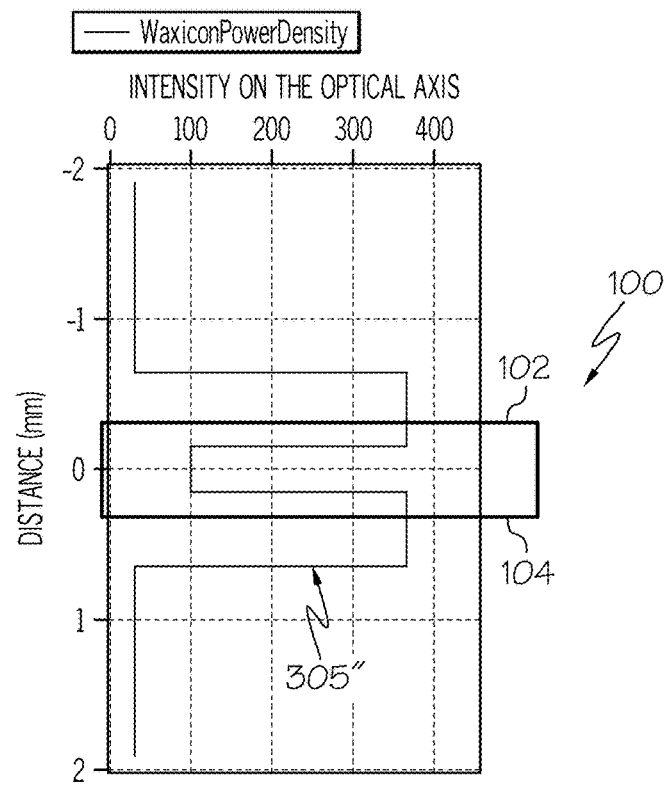

FIGS. 10A and 10B graphically depict manipulation of the intensity profiles of two laser beam focal lines through a silica-containing substrate 100. In FIG. 10A, the intensity profile 305' of the laser beam focal line has rectangular, "top hat" shape. This intensity profile 305' may be formed by waxicon optics, for example, and may result in stronger modification proximate the surfaces of the silica-containing substrate than the Gaussian profile depicted in FIGS. 9A-9C. In the intensity profile 305" depicted in FIG. 10B has two maximum peaks proximate the first surface 102 and the second surface 104 of the silica-containing substrate 100, which results in stronger modification proximate the first surface 102 and the second surface 104 than in the middle of the silica-containing substrate. The laser beam focal line of FIG. 10B has a greater intensity at a first end of the laser beam focal line and a second end of the laser beam focal line than a center region of the laser beam focal line. Custom optics may be employed to create the intensity profile 305" depicted in FIG. 10B.

Other approaches to enhance the laser damage/modification near the surfaces of the silica-containing substrates include heating or cooling the surfaces to have a temperature gradient, such as through application of hot air flow, and thus in turn to have differential laser/glass interaction through the glass thickness.

Example

A 50 mm×50 mm Corning code 7980 fused silica substrate with 0.36 mm thickness was laser damaged using a system equipped with a Coherent Hyper-Rapid-50 picosecond laser operating at 532 nm wavelength. The beam delivery optics were configured to create a Gauss-Bessel laser beam focal line, with an optical intensity distribution along the beam propagation axis of 0.74 mm full-width half maximum, and a spot size of 1.2 µm in diameter, as measured by the diameter of the first nulls or intensity minimums in the Bessel-like cross sectional profile of the beam. Each damage track was formed by exposing the silica-containing substrate to a 50 µJ laser burst that contained five laser pulses, each had a duration of 7.2 psec and the time interval between the pulses inside each burst was 20 ns. The laser-processed silica-containing substrate was then etched in a static (no physical agitation, no ultrasound) bath with 20% HF (vol %) and 12% HCl (vol %) at 47° C. The bulk etch rate was 0.0046 µm/s-0.005 µm/s.

Figure 11B:
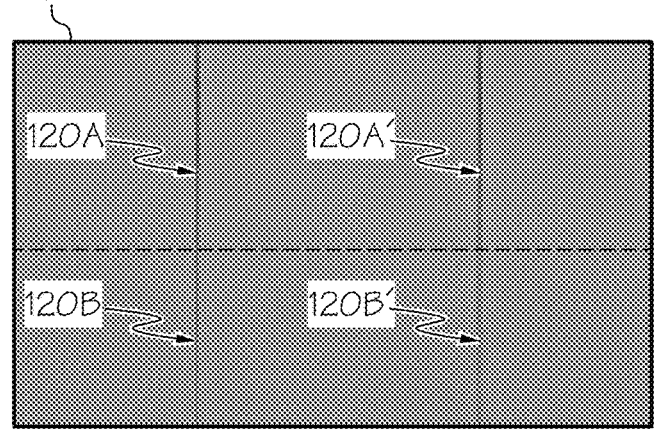
Figure 11C:
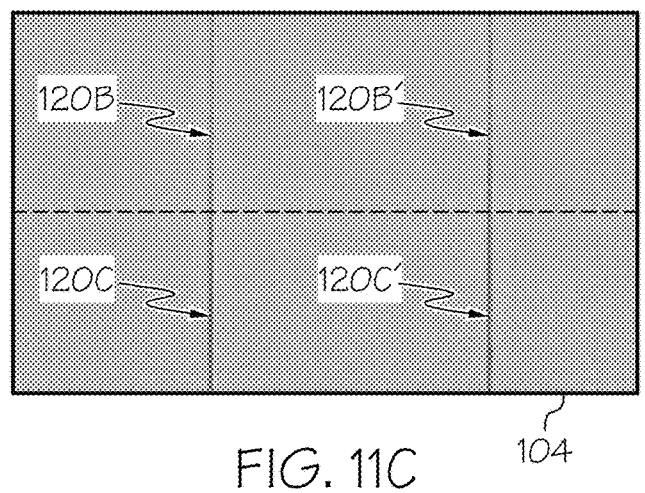

FIG. 11A show images of the resulting damage tracks 120, 120' and 120" made in the 0.36 mm thick fused silica substrate at low magnification with the sample under back lighting prior to etching. The lateral spacing (i.e., pitch) of the damage tracks in the image of FIG. 11A is 150 µm. It is clear from the optical microscope image of FIG. 11A that each damage track has more strongly modified sections (the darker linear features in the optical microscope image, above and below the two horizontal dash lines) near the first surface 102 (a first modified section) and the second surfaced 104 (a second modified section), and a weaker third modified section in the middle of the glass (the lighter linear features in the optical microscope image, between the two horizontal dash lines). Thus the level of modification for the third modified section is less than the level of modification for the first modified section and the second modified section. The differences are more clearly revealed in the high magnification images of FIG. 11B (first surface 102) and of FIG. 11C (second surface 104).

The damage tracks 120, 120', 120" each have at least a first segment 120A, 120A', 120A", a second segment 120B, 120B', 120B", and a third segment 120C, 120C', 120C".

It is noted that the differences in the damage track intensity are not explained by optical intensity differences created by the quasi-non-diffracting beam (Gauss-Bessel) forming optics. The focal line intensity was measured using a high NA microscope objective and a CCD camera scanned along the optical axis, and shown to closely follow a Gauss-Bessel intensity profile. The position of the focus was set to achieve near maximum intensity near the center of the silica-containing substrate, with slightly diminished intensity near each of the surfaces. The expected intensity variation for this focal line through depth of the 0.35 mm thick glass is approximately 6-8%.

Figure 5:
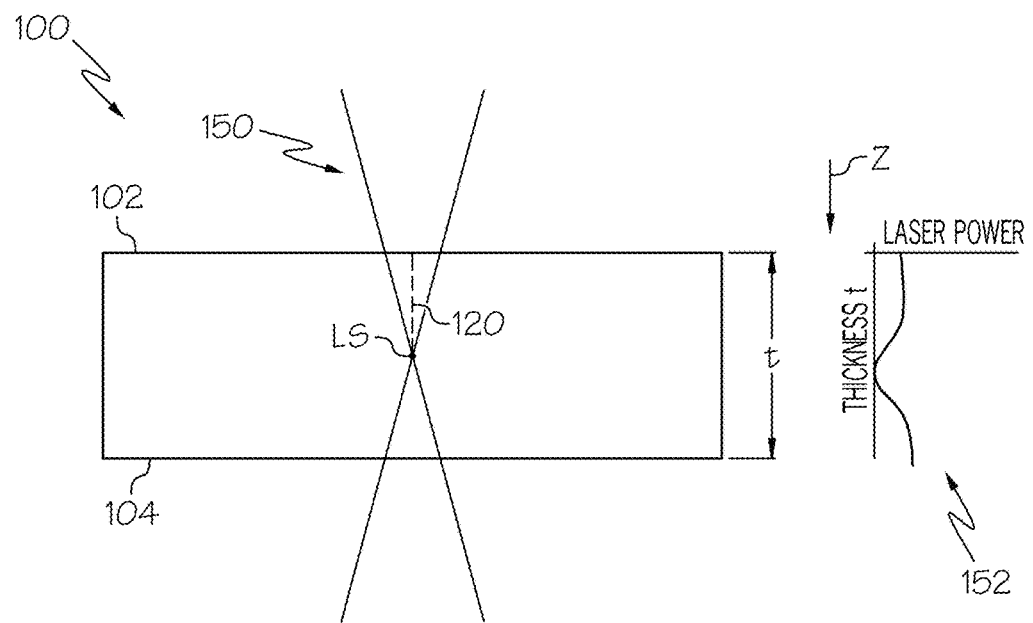
FIG. 5 schematically depicts a method of forming a damage track within a silica-containing substrate by scanning a laser spot through a bulk of the silica-containing substrate while modulating the intensity of the laser spot according to one or more embodiments described and illustrated herein.

FIG. 12 shows a side view optical microscopy image of an etched via 510 following the etching process of the example. As shown, the via 110 has an hourglass shape with a narrow waist w. The via 510 has an interior wall profile similar to example via 110 schematically depicted in FIG. 5. Referring to FIGS. 5 and 12, the via 510 has the following interior wall profile: $\theta_1=\theta_4=1°$, $\theta_2=\theta_3=8°$; $L_1=L_4=62$ µm, $L_2=L_3=88$ µm; first diameter $D_1=49.5$ µm; second diameter $D_2=51.2$ µm; and $D_w=25.7$ µm. In this case, the damage track is approximately symmetric about the middle plane of the fused substrate thickness and results in a symmetrical via about a horizontal centerline, as oppose to the case illustrated in FIG. 3.

Figure 13A:
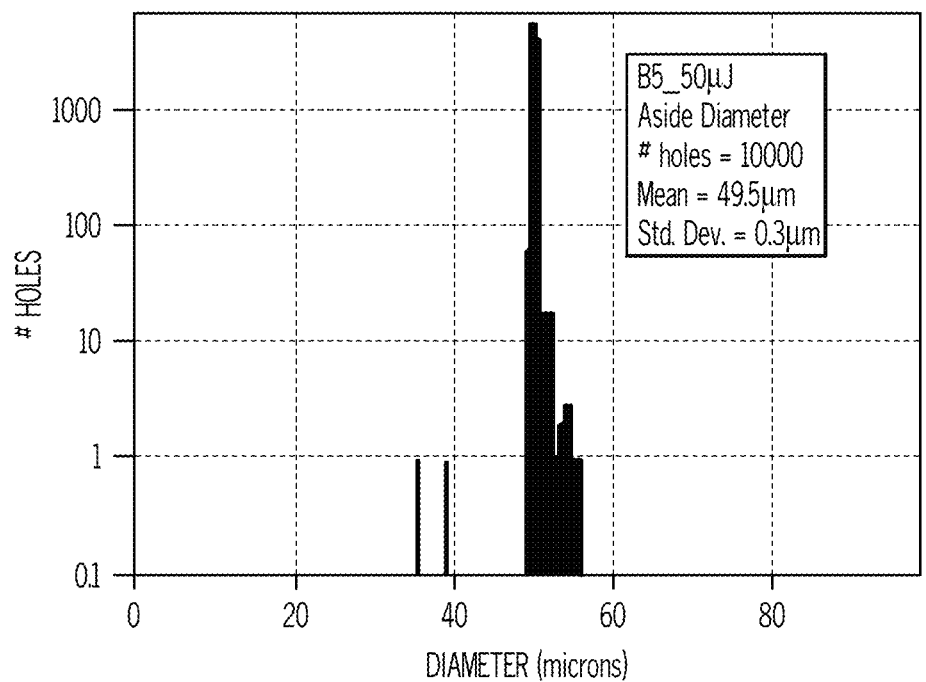
FIGS. 13A-13C graphically depict histograms showing the distribution of a first diameter, a second diameter, and a waist diameter of vias within a silica-containing substrate formed by a laser-damage-and-etch process according to one or more embodiments described and illustrated herein.
Figure 13B:
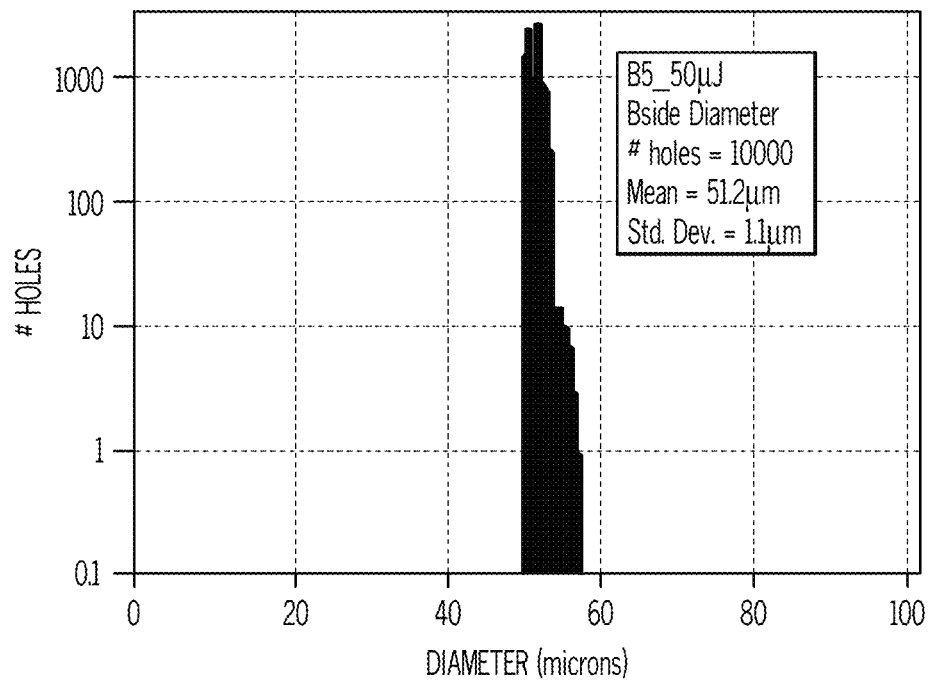
Figure 13C:
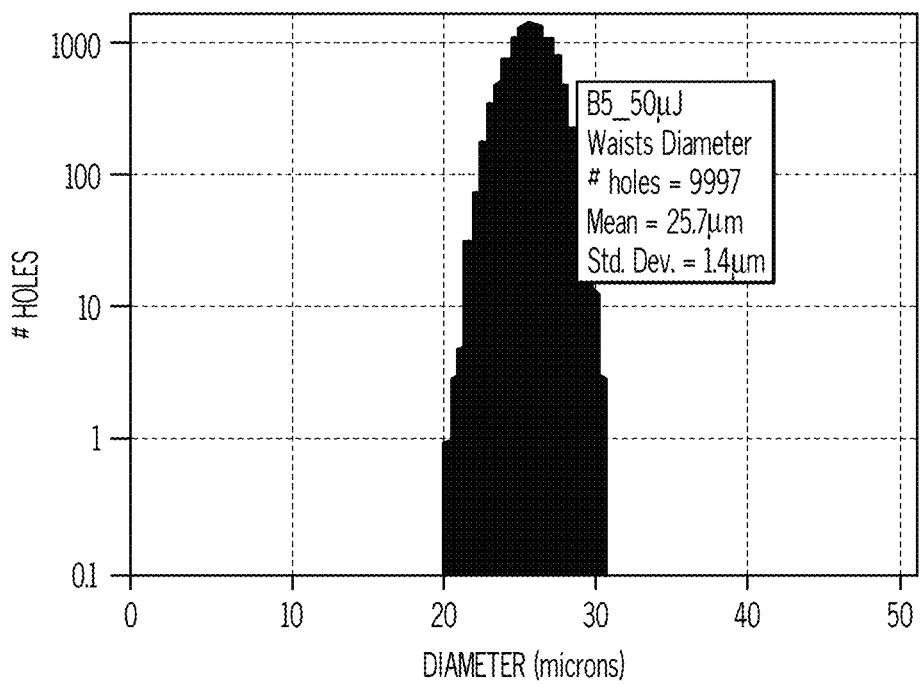
Figure 14A:
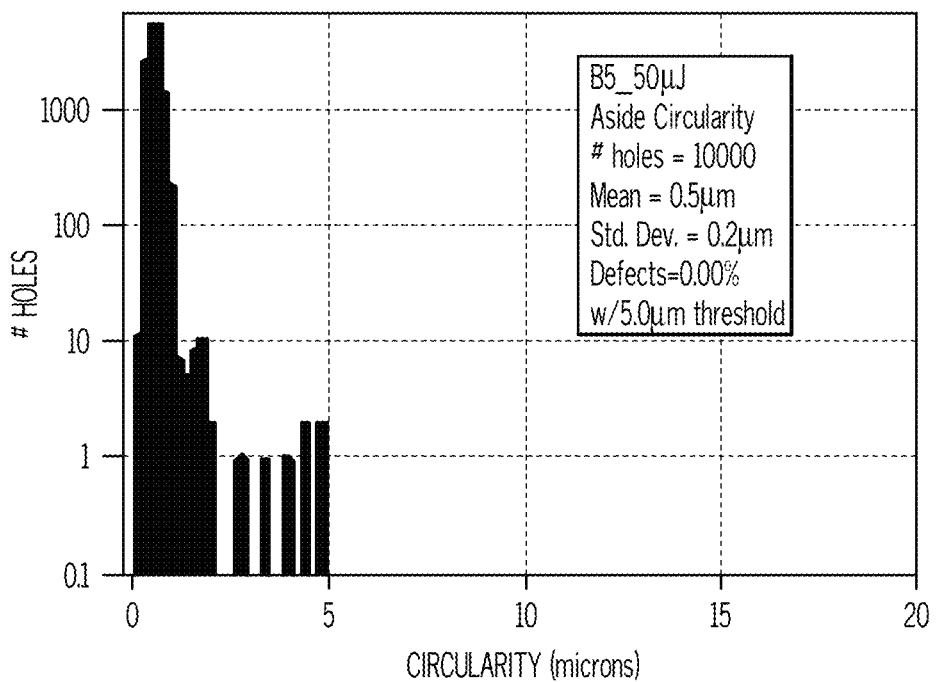
FIGS. 14A-14C graphically depict histograms showing the distribution of circularity for a first diameter, a second diameter, and a waist diameter of vias within a silica-containing substrate formed by a laser-damage-and-etch process according to one or more embodiments described and illustrated herein.
Figure 14B:
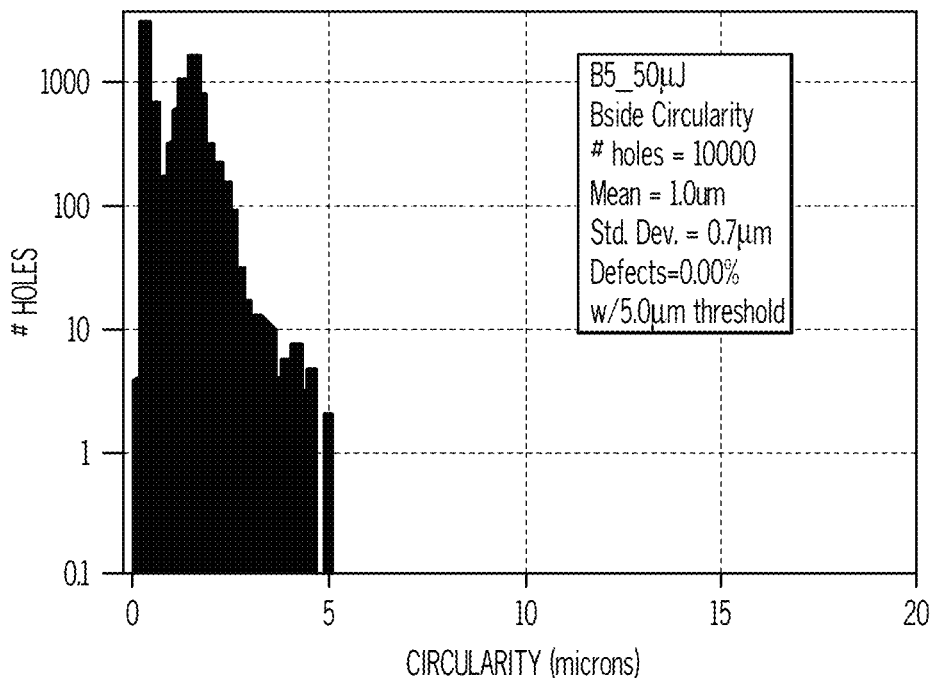
Figure 14C:
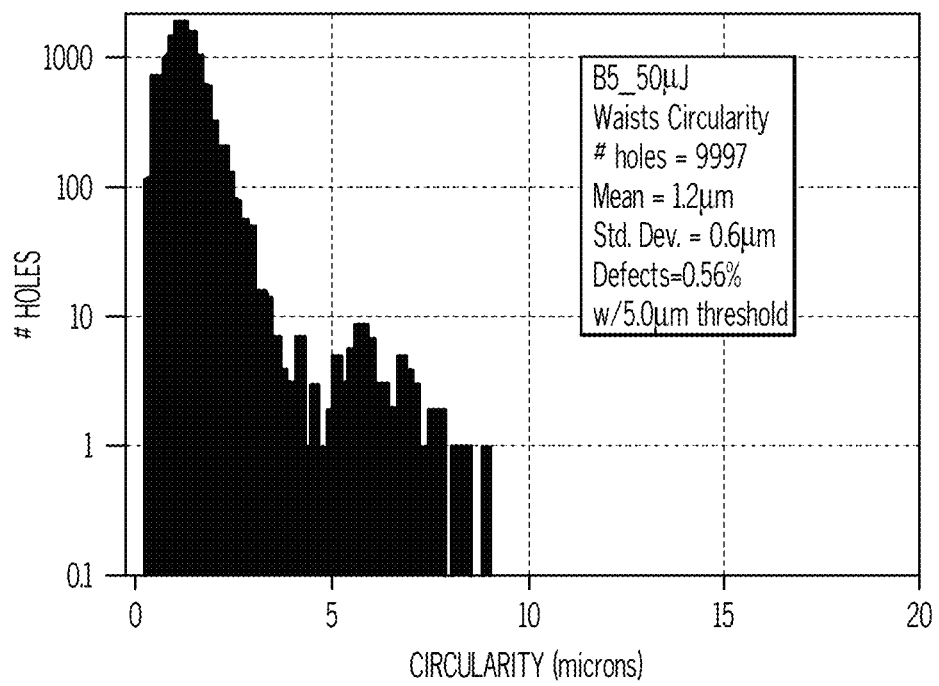

The silica-containing substrate made with this process exhibited very low via-to-via variation at the part level. This indicates the process is stable and not unduly influenced by any small variations in laser energy or system focus. Both the diameter and the circularity are very well controlled for top, waist and bottom of 10000 vias, as shown in FIGS. 13A-13C and 14A-14C. FIG. 13A is a histogram showing the first diameter, FIG. 13B is a histogram showing the second diameter, and FIG. 13C is a histogram showing the waist diameter for a number of holes as indicated in each graph. Dimensional control is shown to be better than +/−1% for first diameter, +/−2.5% for second diameter, and +/−6% for waist diameter.

Another metric for via quality is circularity, which may be measured for the first diameter (FIG. 14A), the second diameter (FIG. 14B), and the waist diameter (FIG. 14C) of each via. As used herein, circularity is determined by fitting a circle to a microscope image of the via. Taking $H=\{h_1, h_2, \ldots, h_n\}$ to be a collection of points $h_i=(x_i,y_i)$ identified along the edge of the via at the first diameter, second diameter, or waist diameter as viewed from above (e.g., from a microscope image of the via at the respective diameters). The points may be, without limitation, at a resolution of approximately 1 µm per pixel. Exactly one least squares fit circle can be evaluated. The center point of this circle $C=(x_c,y_c)$ and its radius R minimize the quantity $\Sigma_{i=1}^{n}(\sqrt{(x_c-x_i)^2+(y_c-y_i)^2}-R^2$. Given the set of distances (diameters) $d_i=\text{dist}(h_i,C)$, a minimum value $d_{min}$ and a maximum value $d_{max}$ can be found. The difference $d_{max}-d_{min}$ is referred to here as circularity. Thus, a theoretically perfect circle, for which all distances d are equal, will have equivalent values of $d_{min}$ and $d_{max}$ leading to a circularity value of zero. Larger values of circularity are indicative of less round holes.

Figure 15A:
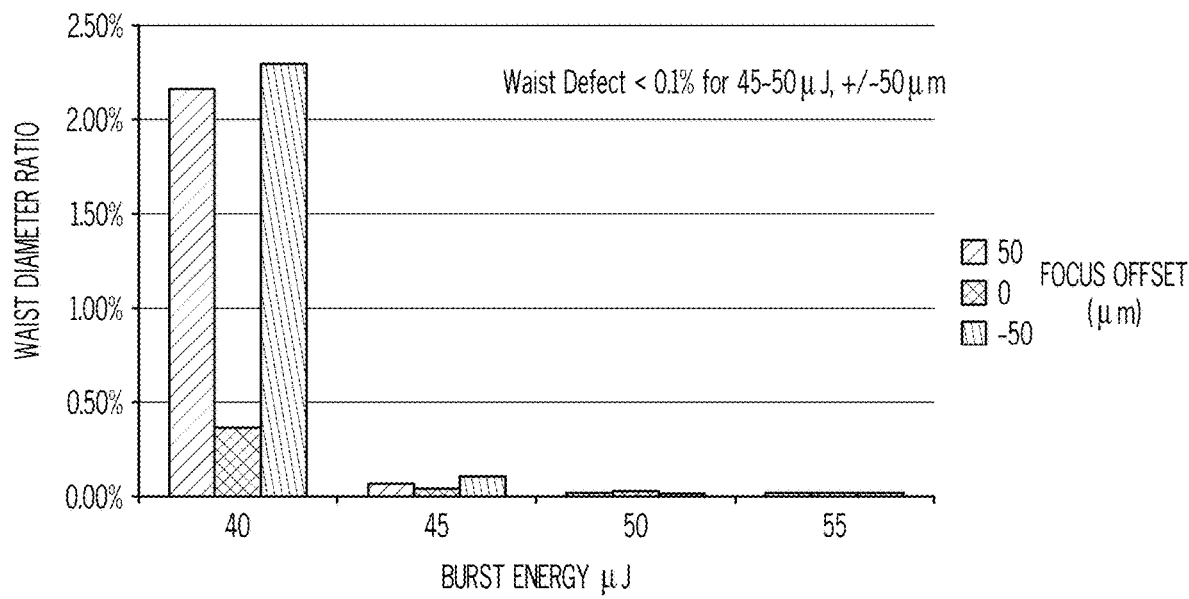
FIGS. 15A and 15B graphically depict histograms showing waist defect and total defect for samples laser processed using a laser beam focal line at four different burst energies and three different focus settings according to one or more embodiments described and illustrated herein.
Figure 15B:
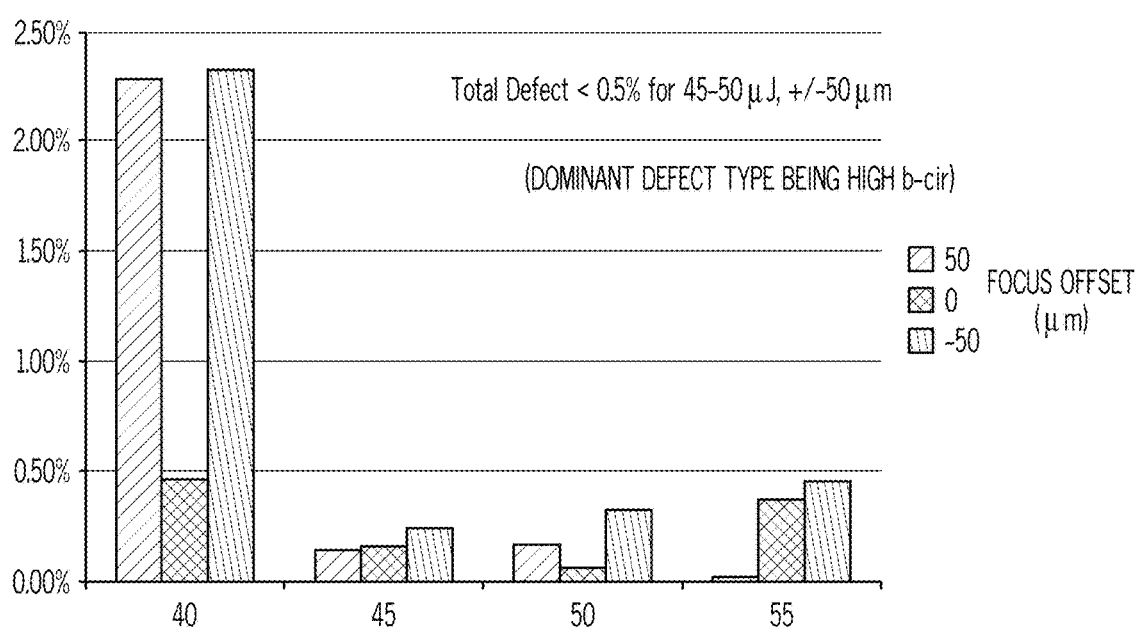
Figure 16A:
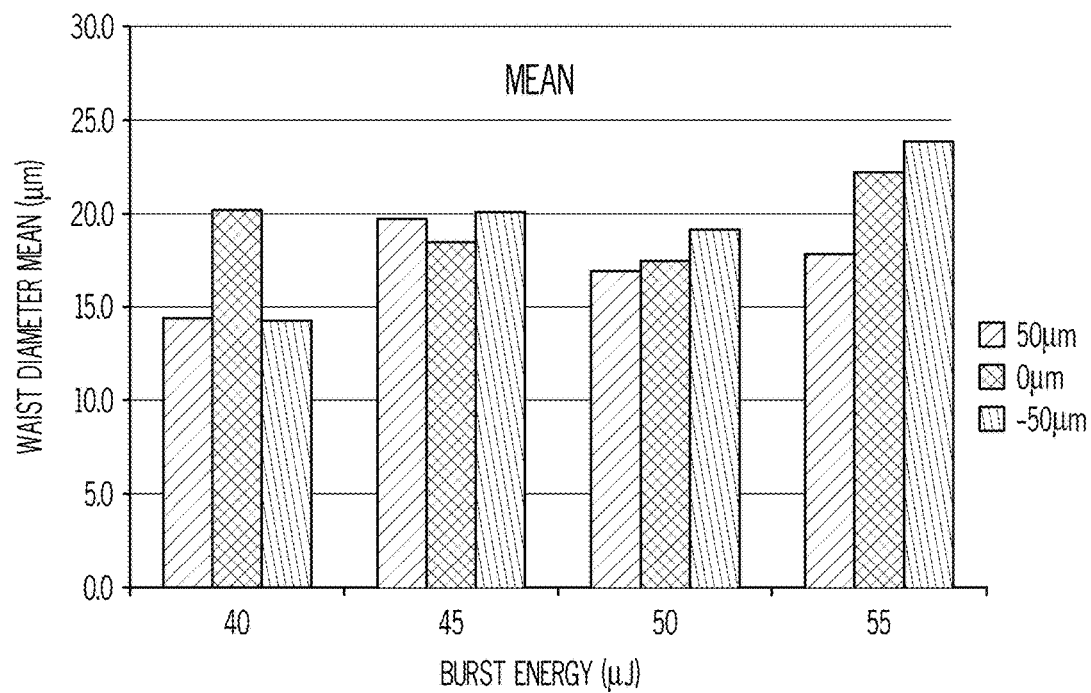
FIGS. 16A-16C graphically depict histograms showing the via waist variation across samples laser processed using a laser beam focal line at four different burst energies and three different focus settings according to one or more embodiments described and illustrated herein.

FIG. 15A is a histogram of waist defect for samples with four different burst energies. A via with too large a circularity is a via that is too elliptical or poorly formed. FIG. 15B is a histogram for total defects (blind vias, vias with greater than 5 µm entrance or second diameters, or waist circularity greater than 5 µm) for samples with four different burst energies. FIG. 16A (mean) and FIG. 16B (standard deviation) are histograms showing via waist variation across a part for samples made with different burst energies and focus conditions. FIG. 16C is a histogram showing a ratio between waist diameter and first diameter for different burst energies and focus conditions.

Figure 16B:
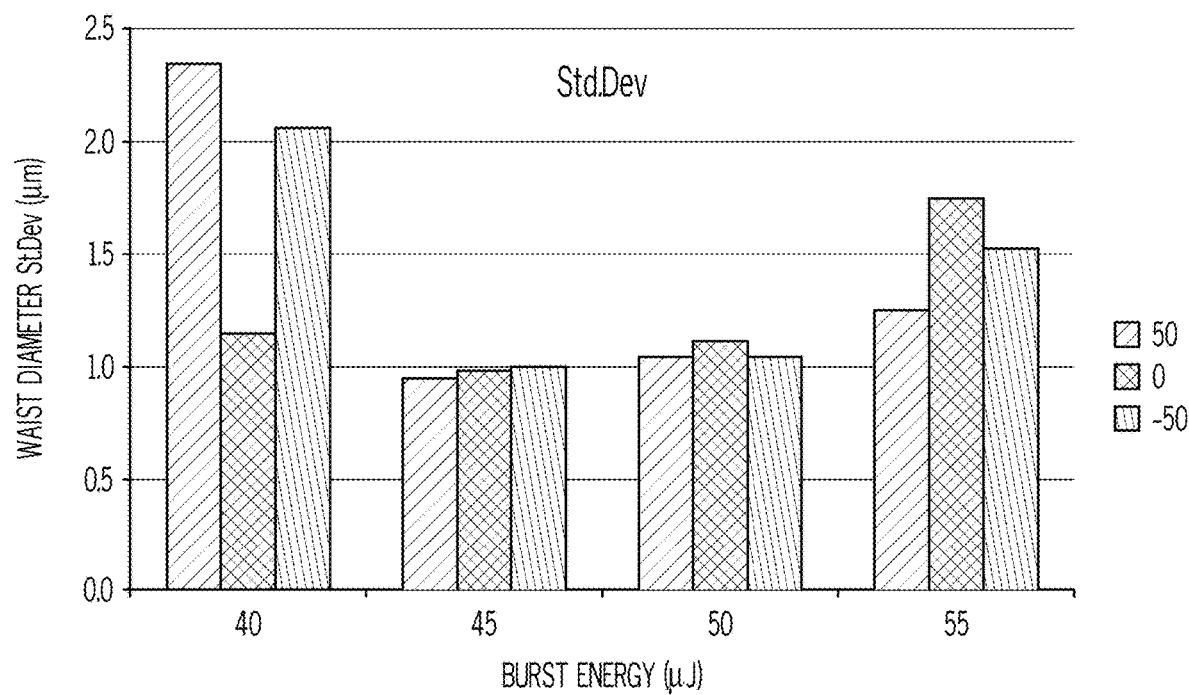
Figure 16C:
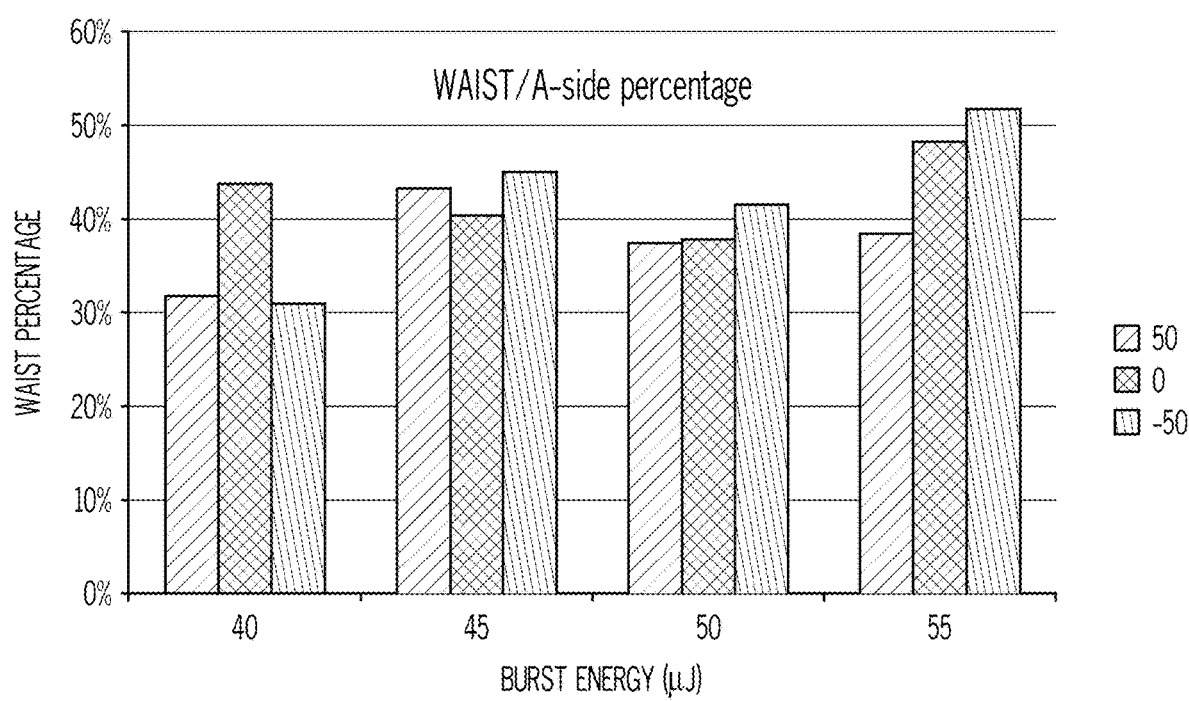

As shown in FIGS. 15A and 15B and FIGS. 16A-16C, as defined by the percentage of vias that have circularities exceeding 5 μm, parts made by this process also have extremely low defect rate, within a reasonable process window (FIGS. 15A and 15B), and the waist opening only has a small variation within a process window (FIGS. 16A-16C), both indicating that the process is stable. Additionally, FIGS. 16A-16C show that a 35%-45% waist diameter/first diameter ratio can be achieved using 5 μJ energy and 100 μm process window.

It should now be understood that embodiments described herein provide a methods and articles providing hourglass-shaped vias in silica-containing substrates, such as high purity silica-containing substrates. The hourglass-shaped vias may be metalized using an electroplating process, for example. The hourglass-shaped vias are formed by a laser-damage-and-etch process by which a customized damage track in formed in the silica-containing substrate prior to etching. The damage track has stronger material modification proximate the surfaces of the silica-containing substrate than in the bulk/middle of the silica-containing substrate. The customized damage track results in an etched via having tapered regions defining a waist. The waist may act as a metal bridge to grow an interior metal layer within the via. Silica-containing substrates with hourglass-shaped vias may be used as interposers in electronic devices, such as high-frequency electronic devices.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

The invention claimed is:

1. A method for processing a substrate comprising silica content of greater than or equal to 90 mol %, a first surface, and a second surface opposite the first surface, the method comprising:
   forming, using a laser beam with a substantially uniform intensity, a damage track through the substrate from the first surface to the second surface, the laser beam comprising a pulsed laser beam focused into a laser beam focal line that is positioned through the substrate, the laser beam focal line producing a material modification within the substrate along the laser beam focal line, thereby forming the damage track, wherein a level of modification of the substrate along the damage track decreases in a first direction starting from the first surface toward a bulk of the substrate, and the level of modification along the damage track decreases in a second direction starting from the second surface toward a bulk of the substrate such that the damage track comprises:
      a first highly modified segment proximate the first surface,
      a second highly modified segment proximate the second surface,
      a minimally modified segment disposed between the first highly modified segment and the second highly modified segment,
   etching, using an etching solution, the substrate such that the first highly modified segment and the second highly modified segment are each etched at a faster rate than a minimally modified segment,
   wherein etching forms a via comprising a first diameter at the first surface, a second diameter at a second surface, and a via waist having a water diameter between the first surface and the second surface, wherein the waist diameter is about 55% or less of each of the first diameter and the second diameter.

2. The method of claim 1, wherein the silica content of the substrate is greater than 95 mol %.

3. The method of claim 2, wherein the silica content of the substrate is greater than 99 mol %.

4. The method of claim 1, wherein the first highly modified segment, the second highly modified segment, and the minimally modified segment each extend linearly in length from the first surface to the second surface.

5. The method of claim 1, wherein at least a portion of the substrate within the minimally modified segment of the damage track is not modified by the laser beam.

6. The method of claim 1, wherein the first highly modified segment and the second highly modified segment are each etched at a faster rate than the minimally modified segment such that the first highly modified segment and the second highly modified segment each have a higher rate of expansion than the minimally modified segment during the etching.

7. The method of claim 1, wherein a diameter of each of the first highly modified segment, the second highly modified segment, and the minimally modified segment is about 1% of the first diameter and of the second diameter.

8. The method of claim 1, wherein the waist diameter is greater than a diameter of each of the first highly modified segment, the second highly modified segment, and the minimally modified segment.

9. The method of claim 1 wherein the via waist is located closer to one of the first surface and the second surface than the other of the first surface and the second surface.

10. The method of claim 1, wherein a ratio between the waist diameter and the first diameter or the second diameter is greater than or equal to 35% and less than or equal to 45%.

11. The method of claim 1, wherein the first diameter and the second diameter are each about 100 microns or less.

12. The method of claim 1, wherein:
   the via comprises a longitudinal axis, an interior wall, a first tapered region located between the first surface and the via waist and a second tapered region located between the second surface and the via waist;
   the first tapered region comprises a first angle measured between the interior wall within the first tapered region and the longitudinal axis; and
   the second tapered region comprises a second angle measured between the interior wall within the second tapered region and the longitudinal axis.

13. The method of claim 1, wherein the laser beam is operated such that:
   the damage track comprises an additional minimally modified segment located between the minimally modified segment and the second highly modified segment; and
   the level of modification of the additional minimally modified segment is less than the level of modification of the first highly modified segment and the second highly modified segment.

14. The method of claim 13, wherein:
   the via comprises:
      a longitudinal axis;
      an interior wall;
      a first tapered region located proximate the first surface, the first tapered region comprising a first angle measured between the interior wall within the first tapered region and the longitudinal axis;
a second tapered region located between the first tapered region and the via waist, the second tapered region comprising a second angle measured between the interior wall within the second tapered region and the longitudinal axis;
a third tapered region adjacent the via waist, the third tapered region comprising a third angle measured between the interior wall within the third tapered region and the longitudinal axis; and
a fourth tapered region located between the third tapered region and the second surface, the fourth tapered region comprising a fourth angle measured between the interior wall within the fourth tapered region and the longitudinal axis; and
each of the second angle and the third angle is less than the first angle and the fourth angle.

15. The method of claim 1, wherein:
the laser beam focal line generates an induced multi-photon absorption within the substrate, the induced multi-photon absorption producing the material modification within the substrate along the laser beam focal line.

16. The method of claim 15, wherein the first surface of the substrate faces an ultra-short pulse laser source that emits the laser beam.

17. The method of claim 15, wherein the pulsed laser beam comprises a pulse burst comprising a series of sub-pulses, each sub-pulse being separated in time from a subsequent sub-pulse in the pulse burst by a duration ($t_p$) from 1 nsec to 50 nsec.

18. The method of claim 15, further comprising adjusting a temperature of one or more of the first surface and the second surface while forming the damage track using the laser beam.

19. The method of claim 1, wherein using the etching solution comprises by spraying the etching solution on the substrate or disposing the substrate in a bath containing the etching solution.

20. The method of claim 1, wherein the etching solution comprises hydrofluoric acid (HF) in combination with hydrochloric acid (HCl) or nitric acid ($HNO_3$) or sodium/potassium hydroxide (NaOH/KOH).

* * * * *

UNITED STATES PATENT AND TRADEMARK OFFICE
CERTIFICATE OF CORRECTION

Page 1 of 2

PATENT NO. : 11,078,112 B2
APPLICATION NO. : 15/978430
DATED : August 3, 2021
INVENTOR(S) : Rachel Eileen Dahlberg et al.

It is certified that error appears in the above-identified patent and that said Letters Patent is hereby corrected as shown below:

On the Title Page

On page 9, in Column 1, item (56), Other Publications, Line 16, delete "Intergrace," and insert -- Integrace, --, therefor.

On page 9, in Column 2, item (56), Other Publications, Line 2, delete "Al-IgZo" and insert -- A-IgZo --, therefor.

On page 9, in Column 2, item (56), Other Publications, Line 5, delete "Microelectronis" and insert -- Microelectronics --, therefor.

On page 9, in Column 2, item (56), Other Publications, Line 46, delete "https:/fweb" and insert -- https://web --, therefor.

On page 9, in Column 2, item (56), Other Publications, Line 48, delete "Matsusaika" and insert -- Matsusaka --, therefor.

On page 9, in Column 2, item (56), Other Publications, Line 73, delete "ofterephthalic" and insert -- of terephthalic --, therefor.

On page 10, in Column 1, item (56), Other Publications, Line 20, delete "Proccessing" and insert -- Processing --, therefor.

On page 10, in Column 1, item (56), Other Publications, Line 28, delete "Besse!" and insert -- Bessel --, therefor.

On page 10, in Column 1, item (56), Other Publications, Line 45, delete "2013)." and insert -- (2013). --, therefor.

On page 10, in Column 2, item (56), Other Publications, Line 6, delete "Dumin." and insert Signed and Sealed this
Second Day of November, 2021

Drew Hirshfeld
*Performing the Functions and Duties of the
Under Secretary of Commerce for Intellectual Property and
Director of the United States Patent and Trademark Office*

CERTIFICATE OF CORRECTION (continued)
U.S. Pat. No. 11,078,112 B2

-- Durnin. --, therefor.

On page 10, in Column 2, item (56), Other Publications, Line 23, delete "triplicate"" and insert -- triplicator" --, therefor.

On page 10, in Column 2, item (56), Other Publications, Line 28, delete "0277-786X199," and insert -- 0277-786X/99, --, therefor.

On page 10, in Column 2, item (56), Other Publications, Line 54, delete "pluse" and insert -- pulse --, therefor.

On page 10, in Column 2, item (56), Other Publications, Line 61, delete "5883-5886," and insert -- S883-S886, --, therefor.

On page 11, in Column 1, item (56), Other Publications, Line 6, delete "micro-achitecture" and insert -- micro-architecture --, therefor.

On page 11, in Column 1, item (56), Other Publications, Line 14, delete "Rev T," and insert -- Rev 1., --, therefor.

In the Claims

In Column 17, Line 66, Claim 1, delete "ata" and insert -- at a --, therefor.